US012685038B2

(12) United States Patent
Wang et al.

(10) Patent No.: US 12,685,038 B2
(45) Date of Patent: Jul. 14, 2026

(54) PHASE-CHANGE RANDOM ACCESS MEMORY DEVICE AND METHOD OF FORMING THE SAME

(71) Applicant: TAIWAN SEMICONDUCTOR MANUFACTURING COMPANY, LTD., Hsinchu (TW)

(72) Inventors: Chin I Wang, Tainan (TW); Huan-Chieh Chen, Taichung (TW); Chia-Wen Zhong, Taichung (TW); Yao-Wen Chang, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 570 days.

(21) Appl. No.: 17/838,166

(22) Filed: Jun. 11, 2022

(65) Prior Publication Data

US 2023/0403956 A1    Dec. 14, 2023

(51) Int. Cl.
H10N 70/00 (2023.01)
H10B 63/00 (2023.01)

(52) U.S. Cl.
CPC ......... H10N 70/8828 (2023.02); H10B 63/20 (2023.02); H10N 70/021 (2023.02); H10N 70/063 (2023.02); H10N 70/066 (2023.02); H10N 70/821 (2023.02); H10N 70/8822 (2023.02); H10N 70/8825 (2023.02)

(58) Field of Classification Search
CPC ............. H10N 70/8828; H10N 70/021; H10N 70/063; H10N 70/066; H10N 70/821; H10N 70/8822; H10N 70/8825; H10N 70/884; H10N 70/231; H10N 70/826; H10B 63/20; H10B 63/30; H10B 63/10; H10B 63/24; H10B 63/80
See application file for complete search history.

(56) References Cited

U.S. PATENT DOCUMENTS

| | | | |
|---|---|---|---|
| 2011/0049456 A1* | 3/2011 | Lung .................. | H10N 70/8828 438/102 |
| 2015/0126013 A1* | 5/2015 | Hwang ................ | H10B 12/315 438/672 |
| 2019/0115393 A1* | 4/2019 | Cheng ................ | H10N 70/8825 |
| 2020/0052197 A1* | 2/2020 | Navarro .............. | H10N 70/884 |
| 2020/0161544 A1* | 5/2020 | Trinh ................. | H10N 70/8413 |
| 2021/0104665 A1* | 4/2021 | Heo .................... | H10N 70/011 |

(Continued)

*Primary Examiner* — Yara B Green
*Assistant Examiner* — Akhee Sarker-Nag
(74) *Attorney, Agent, or Firm* — NZ Carr Law Office PLLC

(57) ABSTRACT

Various embodiments of the present disclosure provide a memory device and methods of forming the same. In one embodiment, a memory device is provided. The memory device includes a substrate, a bottom electrode disposed over the substrate, a top electrode disposed over the bottom electrode, and a phase change layer disposed between the top electrode and the bottom electrode. The phase change layer is a laminated structure comprising a first layer of phase change material and a second layer of phase change material alternatingly stacked, and the first layer of phase change material is chemically different from the second layer of phase change material, wherein the first layer of phase change material has a first thickness that is less than a second thickness of the second layer of phase change material.

20 Claims, 19 Drawing Sheets

(56) References Cited

U.S. PATENT DOCUMENTS

| 2021/0249592 | A1 | 8/2021 | Wu | |
| 2022/0209105 | A1* | 6/2022 | Brew | ................. G11C 13/0069 |
| 2023/0263079 | A1* | 8/2023 | Yang | ................... H10N 70/883 |
| | | | | 257/4 |

* cited by examiner 626-2

B

B

610

600

626-2

626-1

650

610

606

628-1

600

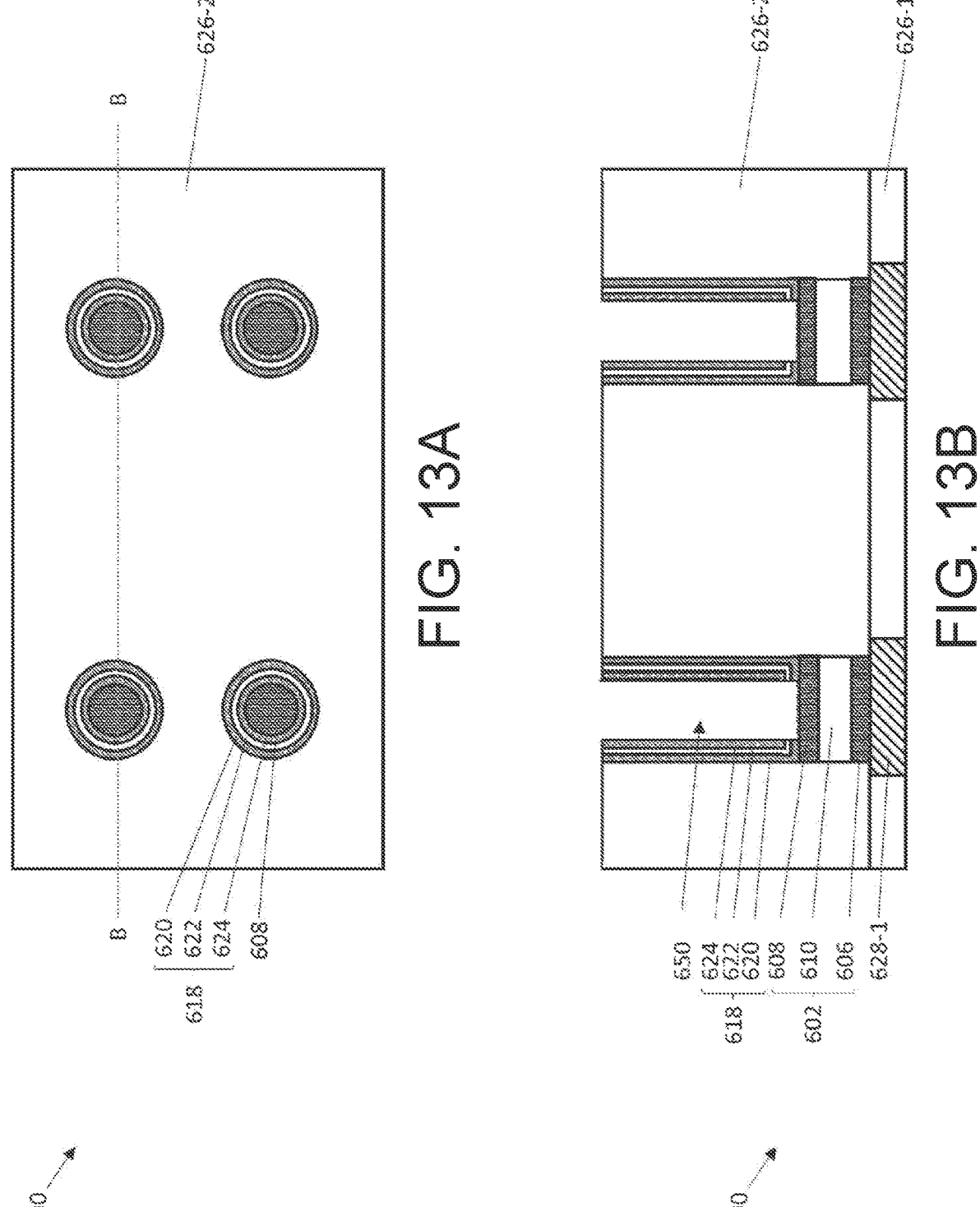

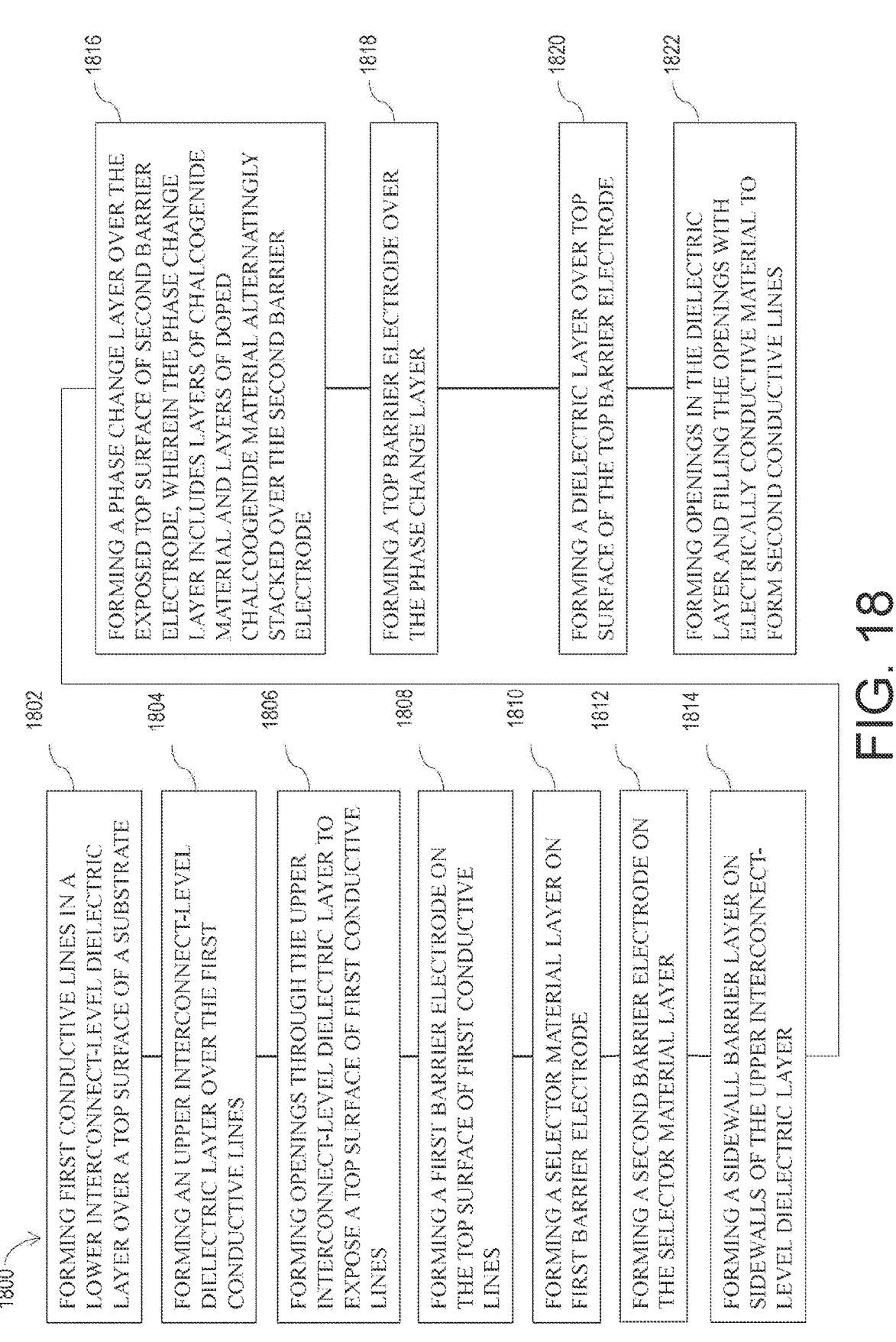

1800

1802 FORMING FIRST CONDUCTIVE LINES IN A LOWER INTERCONNECT-LEVEL DIELECTRIC LAYER OVER A TOP SURFACE OF A SUBSTRATE

1804 FORMING AN UPPER INTERCONNECT-LEVEL DIELECTRIC LAYER OVER THE FIRST CONDUCTIVE LINES

1806 FORMING OPENINGS THROUGH THE UPPER INTERCONNECT-LEVEL DIELECTRIC LAYER TO EXPOSE A TOP SURFACE OF FIRST CONDUCTIVE LINES

1808 FORMING A FIRST BARRIER ELECTRODE ON THE TOP SURFACE OF FIRST CONDUCTIVE LINES

1810 FORMING A SELECTOR MATERIAL LAYER ON FIRST BARRIER ELECTRODE

1812 FORMING A SECOND BARRIER ELECTRODE ON THE SELECTOR MATERIAL LAYER

1814 FORMING A SIDEWALL BARRIER LAYER ON SIDEWALLS OF THE UPPER INTERCONNECT-LEVEL DIELECTRIC LAYER

1816 FORMING A PHASE CHANGE LAYER OVER THE EXPOSED TOP SURFACE OF SECOND BARRIER ELECTRODE, WHEREIN THE PHASE CHANGE LAYER INCLUDES LAYERS OF CHALCOGENIDE MATERIAL AND LAYERS OF DOPED CHALCOGENIDE MATERIAL ALTERNATINGLY STACKED OVER THE SECOND BARRIER ELECTRODE

1818 FORMING A TOP BARRIER ELECTRODE OVER THE PHASE CHANGE LAYER

1820 FORMING A DIELECTRIC LAYER OVER TOP SURFACE OF THE TOP BARRIER ELECTRODE

1822 FORMING OPENINGS IN THE DIELECTRIC LAYER AND FILLING THE OPENINGS WITH ELECTRICALLY CONDUCTIVE MATERIAL TO FORM SECOND CONDUCTIVE LINES

FIG. 18

PHASE-CHANGE RANDOM ACCESS MEMORY DEVICE AND METHOD OF FORMING THE SAME

BACKGROUND

A phase-change random-access memory (PCM) device is a form of non-volatile random-access memory. PCM technology is based upon a material that can be either amorphous or crystalline according to the ambient temperatures. The material may be heated above or cooled below its crystallization point to control the state of the material to either crystalline state or amorphous state. When the material is in the amorphous state, the material has a high electrical resistance. When the material is in the crystalline state, the material has a low electrical resistance. The value of the electrical resistance represents a unit of data (e.g., logical "0" state and "1" state) and can thus be used for data storage.

While existing PCMs have generally been adequate for their intended purposes, they have not been entirely satisfactory in all respects. Particularly, materials having a high crystallization point require higher power (e.g., mA-level current) to achieve a crystalline phase, resulting in high power consumption and reduced operating speeds of the PCM device. Therefore, an improved PCM device and methods of forming the same are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-17A are a top view of a portion of a memory device during various stages of manufacturing, in accordance with some embodiments of this disclosure.

FIGS. 6B-17B are a vertical cross-sectional view of the portion of the memory device taken along the plane B-B shown in FIGS. 6A-17A.

FIG. 18 is a flowchart illustrating exemplary processing steps of a method for forming the memory device, in accordance with some embodiments of the present disclosure.

DETAILED DESCRIPTION

Figure 1B:
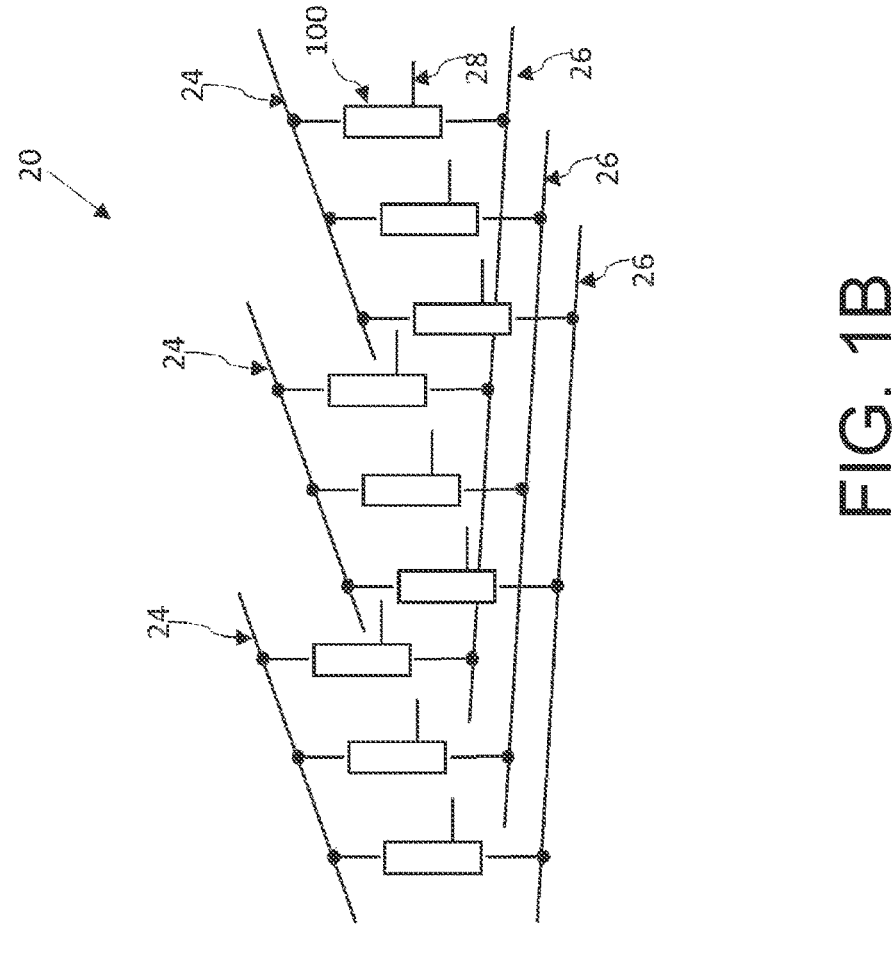
FIG. 1B is a schematic view of a memory structure having a plurality of PCM cells constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A phase-change random-access memory (PCM or PCRAM) is a non-volatile memory device that includes a phase change material arranged between a top electrode and a bottom electrode. The PCM may be composed of many PCM cells that operate independently. The PCM cells may be integrated in an interconnect structure, in which a metal line or via may serve as the top and bottom electrodes of the PCM cell. The PCM cells may operate as a data storage element by heating the phase change material to cause reversible switches between crystalline state (e.g., programming the PCM cell or 'SET') and amorphous state (e.g., erasing the PCM cell or 'RESET') of the phase change material, which represent at least two dramatically different resistivities for logical "1" state and "0" state. For example, to write a "1" state (data) representing a low resistivity phase of the phase change material, an electric current may be applied to the phase change material at a temperature above the crystallization temperature but below the melting temperature of the phase change material for to achieve a crystalline phase. As the phase change material heats to a temperature above the crystallization temperature, the material may enter a crystalline state where the phase change material exhibits a low electrical resistance. With the low resistance value, a charge may flow into the phase change material to establish the "1" state value.

To write a "0" state (data) representing a high resistivity phase of the phase change material, a large electric current may be applied to the phase change material to melt the phase change material at a temperature higher than the melting temperature of the phase change material. The electric current is abruptly cut off to lower the temperature to below the crystallization temperature of the phase change material to quench and stabilize the amorphous structure of the phase change material. As the phase change material enters the amorphous state, the phase change material exhibits a high resistance value. The high resistance value may impede a charge from flowing into the phase change material to establish a "0" state value.

Figure 1A:
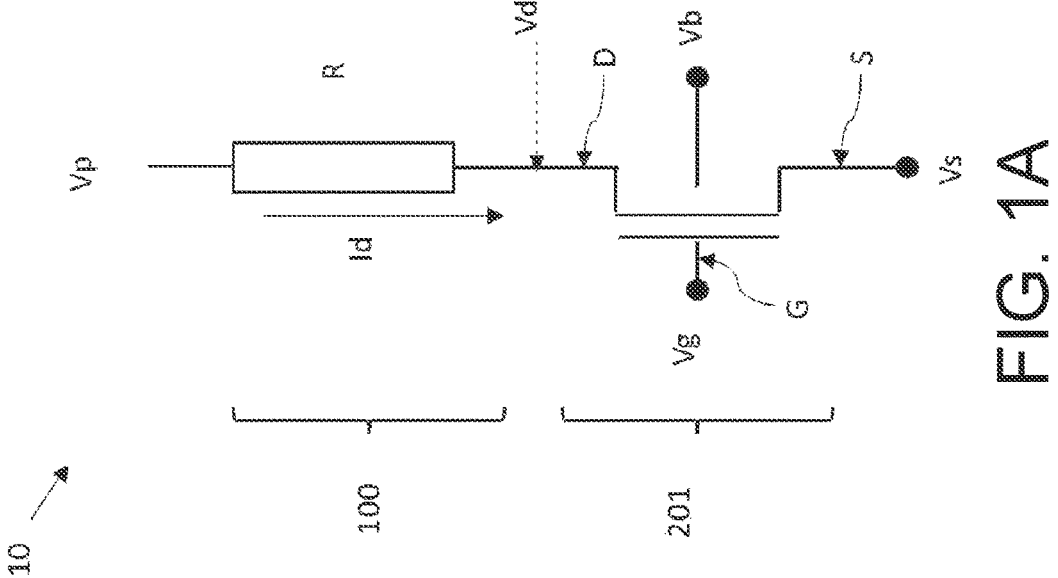
FIG. 1A is a schematic view of a PCM structure constructed in accordance with some embodiments of the present disclosure.

FIG. 1A is a schematic view of a PCM structure 10 constructed in accordance with some embodiments of the present disclosure. The PCM structure 10 may include one PCM cell 100 and a current-controlling device 201 connected together. The PCM cell 100 includes a phase change material layer interposed between two electrodes. In one embodiment, the resistance of the phase change material layer is configured to be adjusted into multiple levels that represent different logic states, respectively. The current-controlling device 201 in the PCM structure 10 may be a device that is operable to control the current flow through the PCM cell 100 during the operations. In one embodiment, the current-controlling device 201 is a transistor (or selector transistor), such as a field effect transistor (FET). For example, the current-controlling device 201 may be a metal-oxide-semiconductor (MOS) FET. The current-controlling device 201 includes source (S), drain (D), and gate (G). The source S and drain D may be designed asymmetrically, such that a voltage drop over the FET during a forming operation and an off-state leakage current may be collectively optimized. The source S and drain D may separately formed, so that the source S and drain D may be independently tuned to achieve the asymmetric structure. The source S and drain D may be different from each other in term of doping concentration, doping profile, and/or doping species.

The current-controlling device 201 may be electrically coupled with the PCM cell 100. In one embodiment, one electrode of the PCM cell 100 is connected to the drain D of the current-controlling device 201. The gate G of the current-controlling device 201 may be connected to a word line, and another electrode of the PCM cell 100 may be connected to a bit line, as will be discussed in more detail with respect to FIG. 2. The corresponding voltages of the gate, source, drain, and substrate during the operations are labeled as Vg, Vs, Vd, and Vb, respectively. During operation, the current through the PCM cell 100 is labeled as Id, and the voltage applied to one electrode of PCM cell 100 from the bit line is labeled as Vp. The PCM structure 10 may be a three terminal memory structure, with the gate of the current-controlling device 201 operating as a first terminal, the electrode of the PCM cell 100 (the electrode that is not directly connected with the drain of the transistor) operating as a second terminal, and the source of the current-controlling device 201 operating as a third terminal. During the operations of the PCM cell 100, the first terminal (gate) may be controlled by a first voltage from the word line, the second terminal may be controlled by a second voltage from the bit line, and the third terminal may be controlled by a third voltage from a source line. In some embodiments, the source is grounded. In some embodiments, the second terminal is grounded. The substrate (or the body) of the current-controlling device 201 may be grounded or floating.

FIG. 1B is a schematic view of a memory structure 20 having a plurality of PCM cells 100 constructed in accordance with some embodiments of the present disclosure. The PCM cells 100 may be configured in an array coupled with a plurality of word lines 24 and a plurality of bit lines 26. In one embodiment, the word lines 24 and the bit lines 26 may be cross-configured. Each of the PCM cells 100 may be operable to achieve multiple resistance levels for multiple bit storage. In one embodiment, source lines 28 are configured to connect to the sources of the PCM cells 100, respectively. The source lines 28 may be configured such that one source line 28 is coupled with one respective PCM cell 100. Alternatively, one source line 28 may be coupled with a subset of the PCM cells 100 in the memory structure 20.

Figure 2:
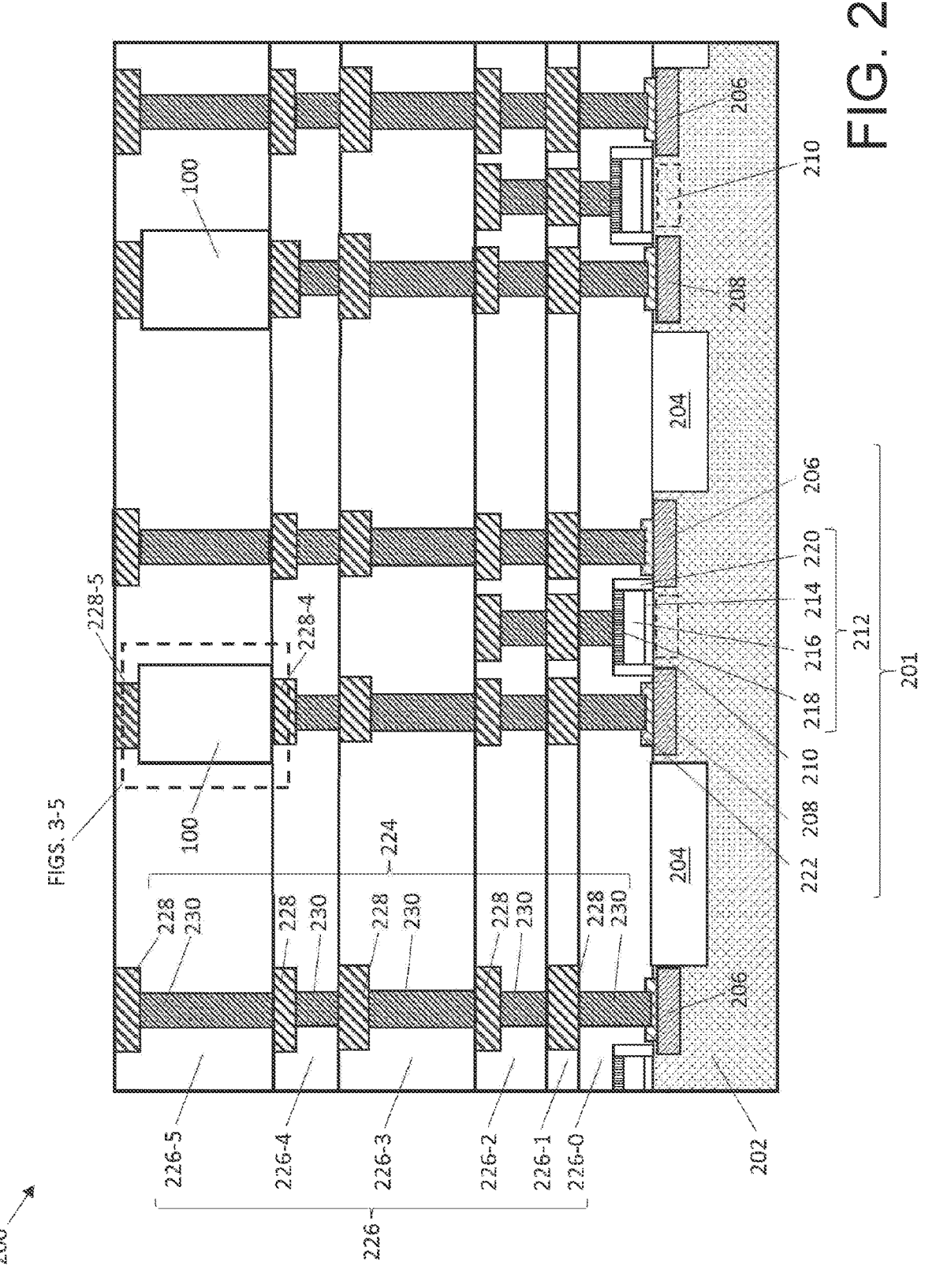
FIG. 2 is a cross-sectional view of a memory device in accordance with some embodiments of the present disclosure.

FIG. 2 is a cross-sectional view of a memory device 200 in accordance with some embodiments of the present disclosure. The memory device 200 is disposed on a substrate 202 and includes one or more PCM cells 100 and corresponding current-controlling devices 201. The memory device 200 can include a two-dimensional array of memory cells arranged in a 1T1R configuration, i.e., a configuration in which one access transistor is connected to one resistive memory cell. The substrate 202 can be a semiconductor substrate such as a silicon substrate. Alternatively or additionally, the substrate 202 may include elementary semiconductor materials, compound semiconductor materials, and/or alloy semiconductor materials. Examples of the elementary semiconductor materials may include, but are not limited to, crystalline silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

The current-controlling devices 201 may provide functions that are needed to operate the PCM cells 100. For example, the current-controlling devices 201 can be configured to control the programming operation, the erase operation, and the read operation of the PCM cells 100. In some embodiments, the memory device 200 may include sensing circuitry and/or a top electrode bias circuitry on the substrate 202. The current-controlling devices 201 may be constructed using complementary metal-oxide-semiconductor (CMOS) technology, and may be any suitable transistors such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. The substrate 202 may optionally include additional semiconductor devices, such as resistors, diodes, capacitors, imaging sensors, inductors, or a combination thereof.

Shallow trench isolation structures 204 including a dielectric material (e.g., silicon oxide) can be formed in an upper portion of the substrate 202. Suitable doped semiconductor wells, such as p-type wells and n-type wells can be formed within each area that is laterally enclosed by a continuous portion of the shallow trench isolation structures 204. The current-controlling devices 201 may be formed on the substrate 202 between the shallow trench isolation structures 204, such that the current-controlling devices 201 are electrically isolated from one another by the shallow trench isolation structures 204.

Each current-controlling device 201 may include a first source/drain region 206, a second source/drain region 208, a channel region 210 extending in the substrate 202 between the first source/drain region 206 and the second source/drain region 208, and a gate structure 212. Each gate structure 212 can include a gate dielectric 214 a gate electrode 216, a gate cap dielectric 218, and a dielectric gate spacer 220. A metal-semiconductor alloy silicide region 222 may be formed on each first source/drain region 206 and second source/drain region 208, respectively. In some embodiments, the channel region 210 may be doped with a first type dopant, and the first source/drain region 206 and the second source/drain region 208 may be doped with a second type dopant opposite to the first type. The "source/drain region(s)" in this disclosure may refer to a source or a drain, individually or collectively dependent upon the context.

Various interconnect structures 224 are formed in inter-connect-level dielectric layers 226 over the substrate 202. The dielectric layers 226 may include multiple dielectric layers 226-0 to 226-5, each of which may be an interlayer dielectric (ILD) layer or an intermetal dielectric (IMD) layer. The dielectric layers 226 may be $SiO_x$, $SiO_xC_yH_z$, or $SiO_xC_y$, where x, y and z are integers or non-integers. Other dielectric material, such as doped or undoped silicate glass, organosilicate glass, porous variants thereof, or combinations thereof, may also be used. The interconnect structures 224 may include conductive features, such as conductive lines 228 and conductive vias 230, formed in the dielectric layers 226. The conductive features may be formed of an electrically conductive material, such as Cu, Co, W, Ru, Mo, Zn, alloys thereof, or combinations thereof. The conductive lines 228 and vias 230 may be formed as an integrated structure using a dual damascene process. The interconnect structures 224 can include source lines (e.g., source lines 28 in FIG. 1B) that connect the sources of the PCM cells 100 to a source-side power supply for an array of memory elements. The voltage provided by the source lines can be applied to the bottom electrodes through the access transistors (e.g., current-controlling devices 201).

While the present disclosure is described using an exemplary embodiment in which the PCM cells 100 are formed as a component of the dielectric layer 226-5, and each PCM cell 100 is electrically connected to a respective conductive line 228-4 and a conductive line 228-5, embodiments of the present disclosure are not limited to any particular location in the interconnect structure for the PCM cells 100. Therefore, the PCM cells 100 may be disposed within any one or more of the dielectric layers 226, and/or between any two vertically adjoining interconnect-level structures. In addition, while the present disclosure is described using an exemplary embodiment in which a set of five interconnect-level structures are formed, embodiments are contemplated herein in which a different number of interconnect-level structures is used.

The interconnect structures 224 may be configured to connect each PCM cell 100 to a corresponding current-controlling device 201, and to connect the current-controlling device 201 to corresponding signal lines. For example, the second source/drain region 208 of the current-controlling device 201 may be electrically connected to a bottom electrode (e.g., first barrier electrode 306 in FIG. 3) of the PCM cell 100 via the conductive lines 228 and vias 230. The gate electrode 216 of each current-controlling device 201 may be electrically connected to a respective word line, which can be embodied as a respective subset of the conductive lines 228 (e.g., conductive line 228-4). A top electrode (e.g., top barrier electrode 316 in FIG. 3) of each PCM cell 100 may be electrically connected to a respective bit line, which can be embodied as a respective subset of the conductive lines 228 (e.g., conductive line 228-5). Each first source/drain region 206 may be electrically connected to a respective source line, which can be embodied as a respective subset of the conductive vias 230. While five levels of interconnect structures 224 are shown, it is understood that more or less interconnect structures can be formed over the substrate 202, and the levels in which the source lines, word lines, and bit lines are formed may be selected based on design parameters.

Figure 3:
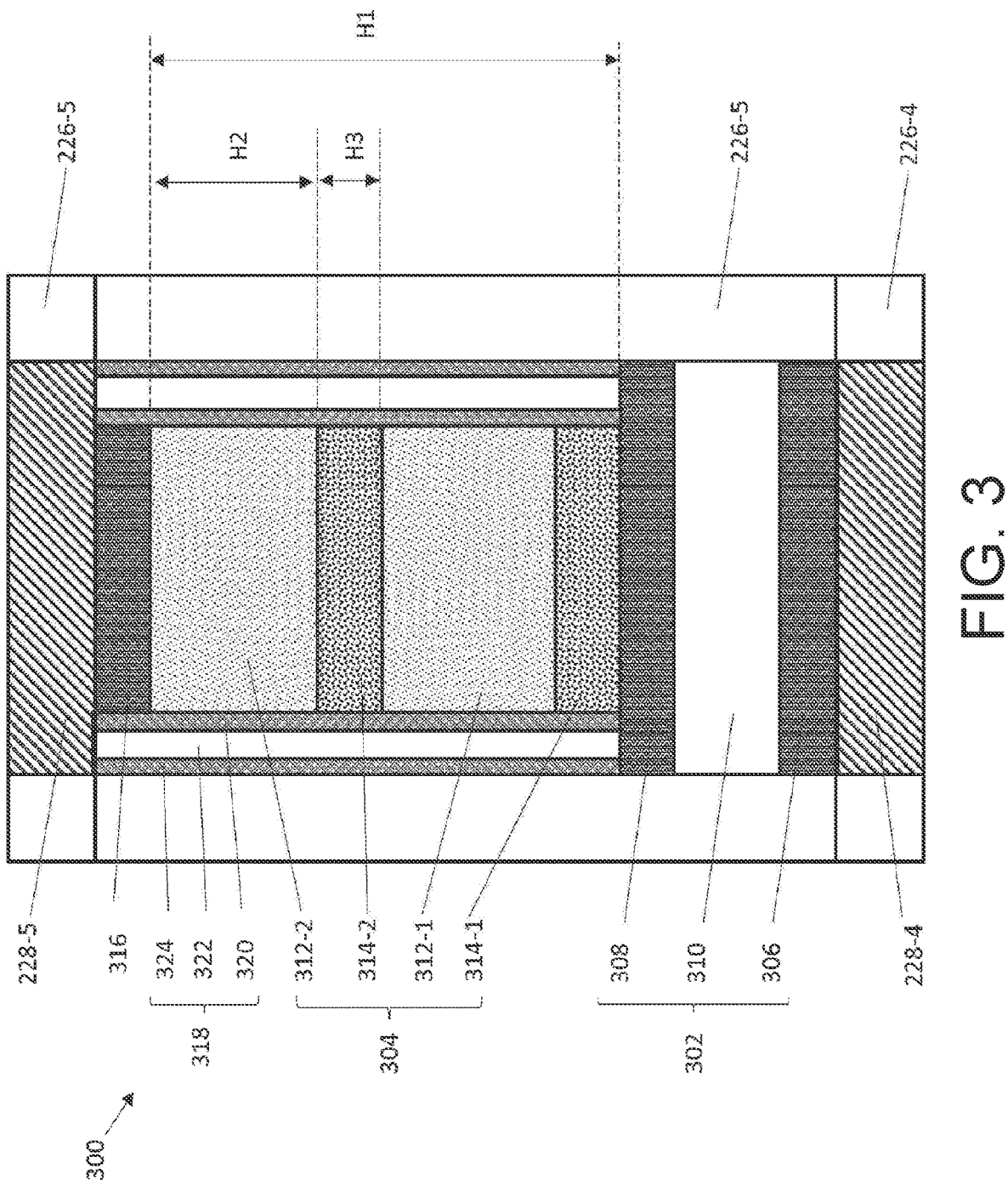
FIG. 3 is a cross-sectional view of a portion of the memory device comprising a PCM cell that may be used to replace the PCM cell of FIG. 2, in accordance with some embodiments of the present disclosure.

FIG. 3 is a cross-sectional view of a portion of the memory device 200 comprising a PCM cell 300 that may be used to replace the PCM cell 100 of FIG. 2, in accordance with some embodiments of the present disclosure. Referring to FIGS. 2 and 3, the PCM cell 300 are disposed between two conductive lines, such as conductive lines 228-4 and 228-5. In some embodiments, the conductive lines 228-4 and 228-5 may be respectively referred to as a bottom electrode and a top electrode. In some embodiments, the conductive lines 228-4 serves as a word line (WL) and the conductive lines 228-5 serves as a bit line (BL). The PCM cell 300 may include a selector 302, a phase change layer 304 disposed over the selector 302, a top barrier electrode 316 disposed over the phase change layer 304, and a sidewall barrier layer 318 disposed on sidewalls of the phase change layer 304 and the top barrier electrode 316. The PCM cell 300 is disposed between the $N^{th}$ dielectric layer 226 and the $(N+1)^{th}$ dielectric layer 226. For example, the PCM cell 300 may be disposed between the dielectric layer 226-4 and the dielectric layer 226-5 of the memory device 200 shown in FIG. 2.

The selector 302 may include a first barrier electrode 306, a second barrier electrode 308, and a selector material layer 310 disposed between the first and second barrier electrodes 306, 308. The first barrier electrode 306 is formed over, or in contact with, a top surface of the conductive line 228-4 in the dielectric layer 226-4. The first barrier electrode 306 may be formed of a conductive material such as TiN, TaN, TiAlN, TaC, WN, Ta, W, Ru, Mo, or the like. The first barrier electrode 306 is configured to reduce and/or prevent the diffusion of metal species from the conductive line 228-4 into the selector material layer 310 and/or the phase change layer 304. In some embodiments, the second barrier electrode 308 serves as a bottom electrode of the PCM cell 300. Joule heating induced by electric current is provided to the phase change layer 304 through the first barrier electrode 306 during operation of the memory device 200. The first barrier electrode 306 may have a thickness in a range of about 1 nm to about 30 nm, although greater or lesser thickness may also be used depending on the application.

The second barrier electrode 308 includes a barrier material that may block interdiffusion of materials between the selector material layer 310 and the phase change layer 304 to be subsequently formed. The second barrier electrode 308 may include any material that is used for the first barrier electrode 306. In some embodiments, the second barrier electrode 308 includes the same material as the first barrier electrode 306.

The selector material layer 310 provides a current-voltage non-linearity to the PCM structure 10 to help reduce leakage current. The selector material layer 310 may have a single-layer or multi-layered structure. In some embodiments, the selector material layer 310 may include an ovonic threshold switch (OTS) material and/or a multilayer tunneling barrier stack structure. An OTS material may be a solid-electrolyte material containing one or more of Ge, Se, Te, or a chalcogenide such as N, P, S, Si, and/or a Te doped chalcogenide such as N, P, S, Si, and/or Te doped AsGeSe, and N, P, S, Si, and/or Te doped AsGeSeSi. Other suitable chalcogenide alloy or materials may also be used. The OTS material may be electrically insulating when an electrical bias voltage thereacross is below a threshold voltage, and may be electrically conducting when the electrical bias voltage thereacross is above the threshold voltage. A multilayer tunneling barrier stack structure may include a stack of multiple material layers that displays non-linear switching characteristics like the OTS material. An exemplary multilayer tunneling barrier stack structure includes a layer stack of $TiO_x$, $AlO_x$, $WO_x$, $Ti_xNyO_z$, $HfO_x$, $Ta_xO_y$, $NbO_x$, or the like, or suitable combinations thereof, where x, y and z are non-stoichiometric values. In one embodiment, the multilayer tunneling barrier stack structure is a layer stack of $Ta_2O_5$, $TaO_x$, and $TiO_2$. The selector material layer 310 may have a thickness in a range of about 2 nm to about 50 nm, although greater or lesser thickness may also be used depending on the application.

In various embodiments, the phase change layer 304 includes a laminated or multi-layered structure formed of a phase change material that will undergo a phase change such as from amorphous to crystalline or vice-versa when heated. In some embodiments, the phase change material includes chalcogenides. Chalcogenides are materials that contain one or more chalcogen element. In one embodiment, the phase change layer 304 includes a layer of undoped chalcogenide material 312 (312-1, 312-2) and a layer of doped chalcogenide material 314 (314-1, 314-2) alternatingly stacked over the selector 302. Doped chalcogenide materials 314 can increase resistivity and crystallization temperature of the phase change material 304, resulting in lower RESET currents (i.e., programming power) and thus reduced energy consumption. Undoped chalcogenide materials 312, on the other hand, provide faster switching speeds needed for the memory device 200. It has been observed that the phase change layer 304 containing laminated or multi-layered structure requires lower operating energy (e.g., about 100 µA RESET current or below) to achieve its crystalline phase due to the presence of multiple interfaces (e.g., an interface between a layer of undoped chalcogenide material 312-1 and a layer of doped chalcogenide material 314-1) in the phase change layer 304. Since each interface introduces interfacial thermal resistance, a constant thermal flux flowing across multiple interfaces will lead to multiple temperature discontinuities and thus decreased thermal conductivity of the phase change layer 304. As a result, the phase change layer 304 can be efficiently heated to its melting temperature with a constant programming current when compared to phase change layers employing one single bulk chalcogenide material (either doped or undoped). As will be discussed in more detail in FIG. 19, the inventive phase change layers with laminated structures provide decreased thermal conductivity and enhanced heat confinement, which are beneficial for fast transformation between an amorphous phase and a crystalline phase. This leads to low energy consumption, fast operating speeds, and improved reliability of PCMs.

In one exemplary embodiment shown in FIG. 3, the phase change layer 304 includes two layers of chalcogenide material 312 (312-1, 312-2) and two layers of doped chalcogenide material 314 (314-1, 314-2) alternatingly stacked. In some embodiments, a first layer of doped chalcogenide material 314-1 is formed on a top surface of the second barrier electrode 308, a first layer of chalcogenide material 312-1 is formed on the first layer of doped chalcogenide material 314-1, a second layer of doped chalcogenide material 314-2 is formed on the first layer of chalcogenide material 312-1, and a second layer of chalcogenide material 312-2 is formed on the second layer of doped chalcogenide material 314-2. In some embodiments, a first layer of chalcogenide material 312-1 is formed on a top surface of the second barrier electrode 308, a first layer of doped chalcogenide material 314-1 is formed on the first layer of chalcogenide material 312-1, a second layer of chalcogenide material 312-2 is formed on the first layer of doped chalcogenide material 314-1, and a second layer of doped chalcogenide material 314-2 is formed on the second layer of chalcogenide material 312-2.

In some embodiments, the first and second layers of chalcogenide material 312-1, 312-2 may include or be made of at least one or more of germanium (Ge), antimony (Sb), tellurium (Te), selenium (Se), and sulfide (S). Exemplary first and second layers of chalcogenide material 312-1, 312-2 may include, but are not limited to, Ge—Sb—Te (GST)-based compounds such as $Ge_2Sb_2Te_5$ (GST 225), Si—Sb—Te based compounds, Ga—Sb—Te based compounds, As—Sb—Te based compounds, Ag—In—Sb—Te (AIST)-based compounds, Ge—In—Sb—Te (GIST)-based compounds, Ti—Sb—Te based compounds, Ge—Sb based compounds, Ge—Te based compounds, Ga—Sb based compounds, Sb—Te based compounds, Si—Sb based compounds, Se—S based compounds, As—Te based compounds, As—Se based compounds, or stoichiometric thereof. Other materials that will undergo a phase change (such as from amorphous to crystalline or vice-versa when heated) may also be used.

In some embodiments, the first and second layers of doped chalcogenide material 314-1, 314-2 may include or be made of the same material as the first and second layers of chalcogenide material 312-1, 312-2 with a dopant added. In various embodiments, the dopant may be non-metal dopant elements or metallic dopant elements. For non-metal dopant elements, atoms having an atomic radius smaller than the atomic radius of Ge, Sb, and Te may be used. Specifically, the dopants are selected so that they do not significantly deform crystal lattice of GST compounds. Exemplary non-metal dopant elements may include, but are not limited to, nitrogen (N), oxygen (O), carbon (C), silicon (Si), boron (B), phosphorus (P), or the like. In cases where GST compounds (e.g., GST 225) are used, exemplary first and second layers of doped chalcogenide material 314-1, 314-2 may include nitrogen-doped GST compounds, oxygen-doped GST compounds, carbon-doped GST compounds, or silicon-doped GST compounds. For metallic dopant elements, atoms having an atomic radius larger than the atomic radius of Ge and easily form covalent bonds with Te may be used. Exemplary metallic dopant elements may include, but are not limited to, tungsten (W), indium (In), gallium (Ga), niobium (Nb), zirconium (Zr), yttrium (Y), molybdenum (Mo), or the like. In cases where GST compounds (e.g., GST 225) are used, exemplary first and second layers of doped chalcogenide material 314-1, 314-2 may include indium-doped GST compounds or tungsten-doped GST compounds.

In some embodiments, which can be combined with any one or more embodiments of the present disclosure, the first and second layers of doped chalcogenide material 314-1, 314-2 may have a dopant concentration in a range from about $1E10^{17}$ $cm^{-3}$ to about 5E20 $cm^{-3}$, such as about 3E21 $cm^{-3}$. In some embodiments, the first layer of doped chalcogenide material 314-1 may have a dopant concentration different than that of the second layer of doped chalcogenide material 314-2. For example, the first layer of doped chalcogenide material 314-1 may have a first dopant concentration and the second layer of doped chalcogenide material 314-2 may have a second dopant concentration that is greater or less than the first dopant concentration. Additionally or alternatively, the first layer of doped chalcogenide material 314-1 may have a first dopant and the second layer of doped chalcogenide material 314-2 may have a second dopant that is different from the first dopant. If desired, each of the first and second layers of doped chalcogenide material 314-1, 314-2 may have more than one dopant.

In some embodiments, which can be combined with any one or more embodiments of the present disclosure, the first and second layers of chalcogenide material 312-1, 312-2 may include a material that is chemically different from each other, and the first and second layers of doped chalcogenide material 314-1, 314-2 may include a material that is chemically different from each other.

In various embodiments, the phase change layer 304 may have a height H1 in a range of about 50 Å to about 800 Å, for example about 350 Å. The first and second layers of chalcogenide material 312-1, 312-2 may each have a height H2, and the first and second layers of doped chalcogenide material 314-1, 314-2 may each have a height H3 that is less than the height H2. In some embodiments, the height H2 and the height H3 may have a ratio (H2:H3) in a range of about 2:1 to about 10:1, for example about 4:1. In some embodiments, the height H1 and the height H3 may have a ratio (H1:H3) in a range of about 5:1 to about 15:1, for example about 10:1.

The PCM cell 300 may also include a top barrier electrode 316 disposed over the phase change layer 304. In one embodiment, the top barrier electrode 316 is disposed above and in contact with the second layer of chalcogenide material 312-2. Alternatively, the top barrier electrode 316 is disposed above and in contact with the second layer of doped chalcogenide material 314-2. In some embodiments, the top barrier electrode 316 serves as a top electrode of the PCM cell 300. The top barrier electrode 316 may include a barrier material that may block interdiffusion of materials between the phase change layer 304 and the top electrode or conductive line (e.g., conductive line 228-5). In some embodiments, the top barrier electrode 316 may include any material that is used for the first barrier electrode 306. In one embodiment, the top barrier electrode 316 includes the same material as the first barrier electrode 306.

The sidewall barrier layer 318 is disposed on sidewalls of the phase change layer 304 and the top barrier electrode 316. The sidewall barrier layer 318 prevents the phase change layer 304 from oxidation during subsequent processes. The sidewall barrier layer 318 also minimizes heat transfer between adjacent PCM cells 100 so as to avoid thermal disturbance which may disable state retention or interrupt the read/write operation. In some embodiments, the sidewall barrier layer 318 includes a nitride layer 320 and an oxide layer 322. In some embodiments, the sidewall barrier layer 318 is a multi-layered structure including a first nitride layer 320, a second nitride layer 324, and an oxide layer 322 disposed between the first and second nitride layers 320, 324 (i.e., Nitride-Oxide-Nitride (NON) structure). Exemplary materials for the oxide and nitride layers may include, but are not limited to, silicon oxide, silicon nitride, silicon oxynitride, silicon oxycarbide, silicon carbon nitride, or the like. In any case, the first nitride layer 320 is in contact with sidewalls of the phase change layer 304 and the top barrier electrode 316. The oxide layer 322 is disposed between and in contact with the first nitride layer 320 and the second nitride layer 324. The second nitride layer 324 is disposed between and in contact with the oxide layer 322 and the dielectric layer 226-5. The first end of the sidewall barrier layer 318 is in contact with the top electrode or conductive line (e.g., conductive line 228-5), while the second end of the sidewall barrier layer 318 is in contact with the second barrier electrode 308.

It has been observed that the phase change layer 304 containing laminated layers of GST-based chalcogenide material does not negatively affect the subsequent etching profile of the phase change layer 304 since the roughness of the topmost layer of the phase change layer 304 (e.g., second layer of chalcogenide material 312-2) only have about 28% increase when compared to the roughness of the phase change layer using a single bulk GST-based chalcogenide material of the same thickness. In one embodiment, the topmost layer of the phase change layer 304 (e.g., second layer of chalcogenide material 312-2) has a root-mean-square (RMS) roughness that is less than 0.200 nm, such as 0.100 nm to about 0.125 nm, for example about 0.117 nm. In addition, the phase change layer 304 shows a compressive stress that is about 52% lower than the stress of the phase change layer using a single bulk GST-based chalcogenide material of the same thickness. Therefore, the use of the phase change layer 304 containing laminated layers of GST-based chalcogenide material does not increase the possibility of the laminated layers peeling off from the selector 302.

Figure 4:
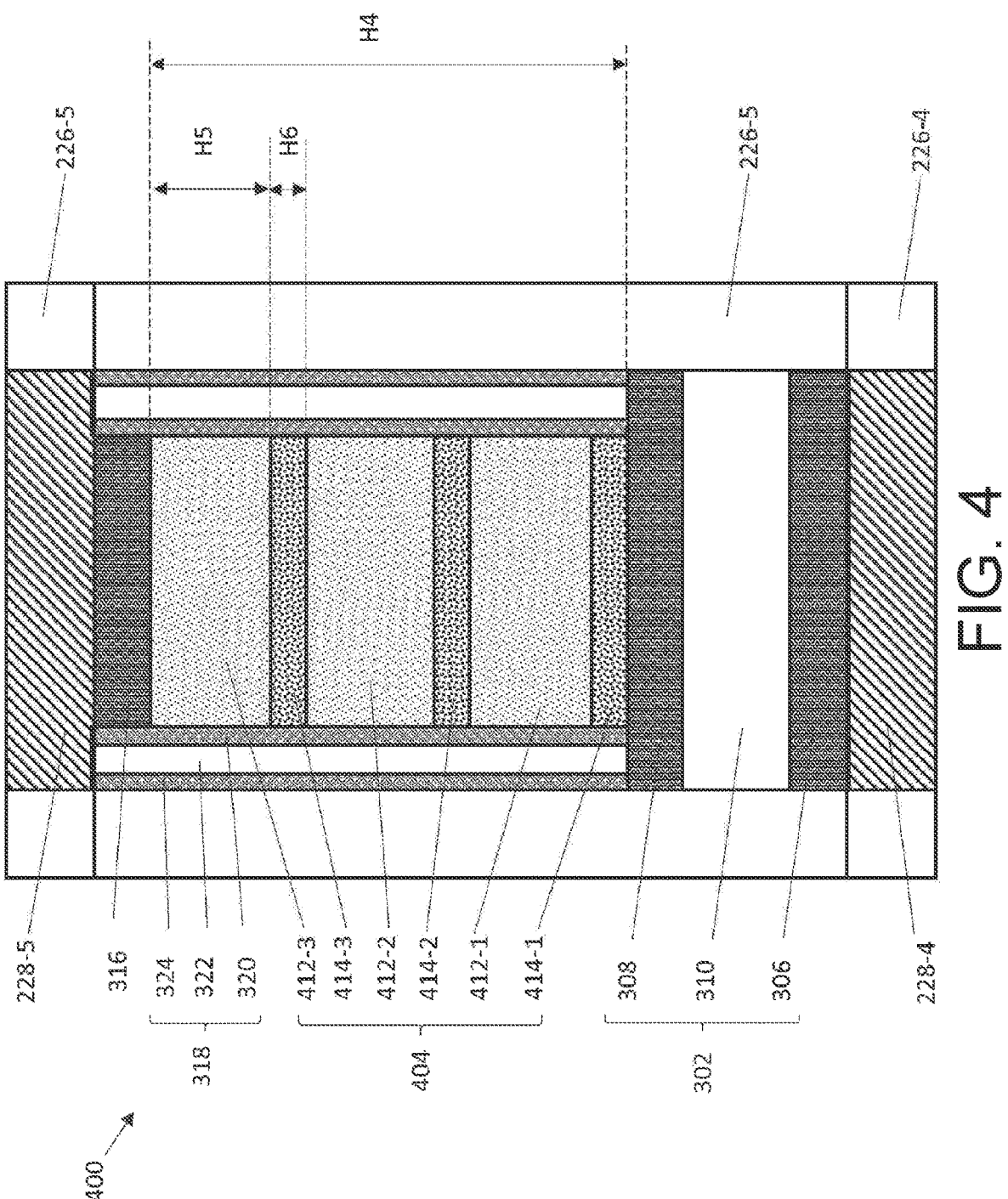
FIG. 4 is a cross-sectional view of a portion of the memory device comprising a PCM cell that may be used to replace the PCM cell of FIG. 2, in accordance with some alternative embodiments of the present disclosure.

FIG. 4 is a cross-sectional view of a portion of the memory device 200 comprising a PCM cell 400 that may be used to replace the PCM cell 100 of FIG. 2, in accordance with some alternative embodiments of the present disclosure. The PCM cell 400 is substantially identical to the PCM cell 300 of FIG. 3 except that the phase change layer 404 includes three layers of chalcogenide material 412 (412-1, 412-2, 412-3) and three layers of doped chalcogenide material 414 (414-1, 414-2, 414-3) alternatingly stacked. In this embodiment, a first layer of doped chalcogenide material 414-1 is formed on a top surface of the second barrier electrode 308, a first layer of chalcogenide material 412-1 is formed on the first layer of doped chalcogenide material 414-1, a second layer of doped chalcogenide material 414-2 is formed on the first layer of chalcogenide material 412-1, a second layer of chalcogenide material 412-2 is formed on the second layer of doped chalcogenide material 414-2, and a third layer of doped chalcogenide material 414-3 is formed on the second layer of chalcogenide material 412-2, and a third layer of chalcogenide material 412-3 is formed on the third layer of doped chalcogenide material 414-3. Alternatively, the first, second, third layers of chalcogenide material 412-1, 412-2, 412-3 may be swapped with the first, second, third layers of doped chalcogenide material 414-1, 414-2, 414-3 so that the first layer of chalcogenide material 412-1 is formed on the top surface of the second barrier electrode 308.

In some embodiments, which can be combined with any one or more embodiments of the present disclosure, the first, second, and third layers of chalcogenide material 412-1, 412-2, 412-3 may include a material that is chemically different from each other, and the first, second, and third layers of doped chalcogenide material 414-1, 414-2, 414-3 may include a material that is chemically different from each other.

Likewise, the phase change layer 404 may have a height H4 in a range of about 200 Å to about 1000 Å, for example about 350 Å. The first, second, third layers of chalcogenide material 412-1, 412-2, 412-3 may each have a height H5, and the first, second, third layers of doped chalcogenide material 414-1, 414-2, 414-3 may each have a height H6 that is less than the height H5. In some embodiments, the height H5 and the height H6 may have a ratio (H5:H6) in a range of about 2:1 to about 10:1, for example about 4:1. In some embodiments, the height H4 and the height H3 may have a ratio (H4:H6) in a range of about 12:1 to about 20:1, for example about 16:1.

Figure 5:
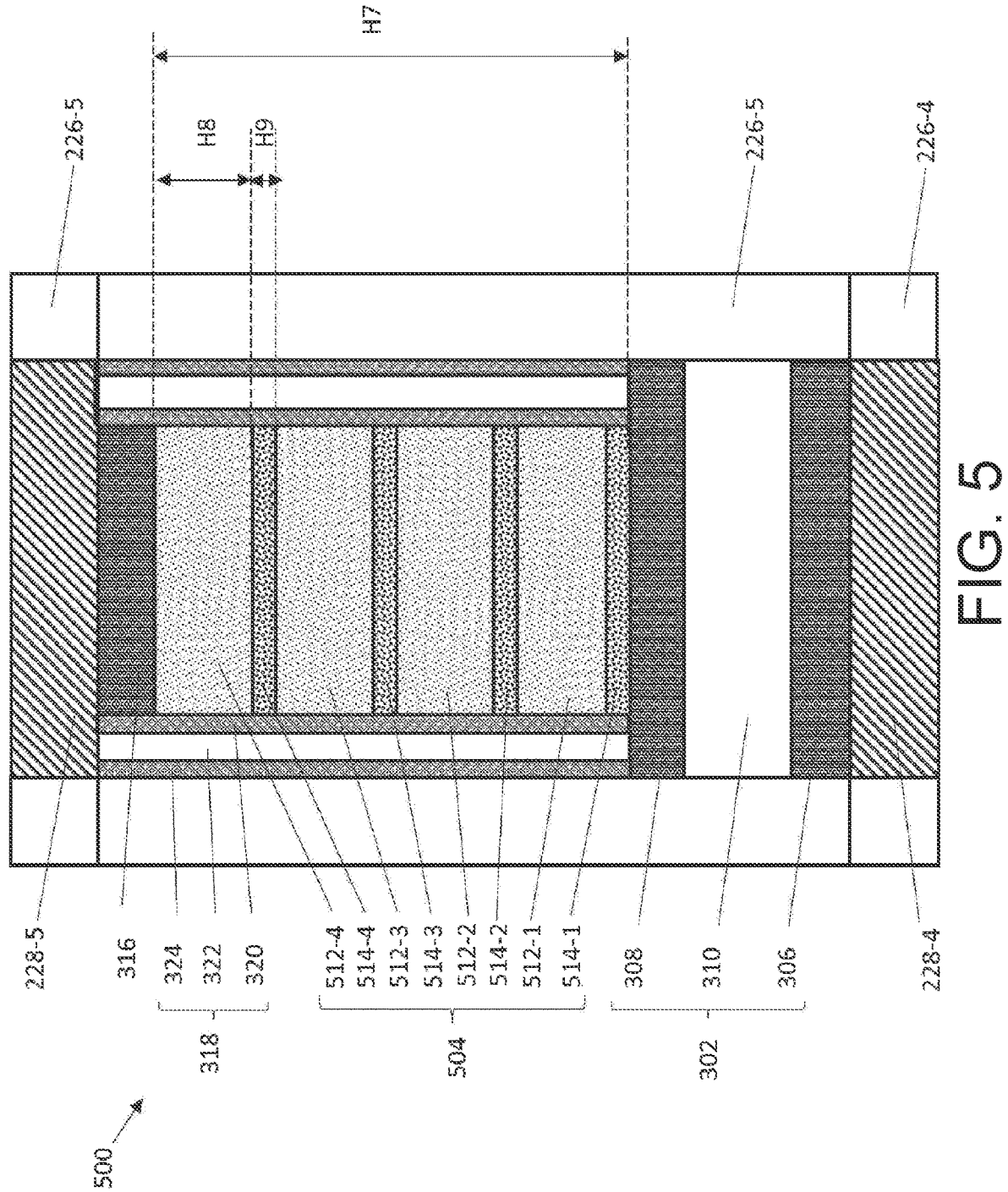
FIG. 5 is a cross-sectional view of a portion of the memory device comprising a PCM cell that may be used to replace the PCM cell of FIG. 2, in accordance with some alternative embodiments of the present disclosure.
Figures 6A, 6B:
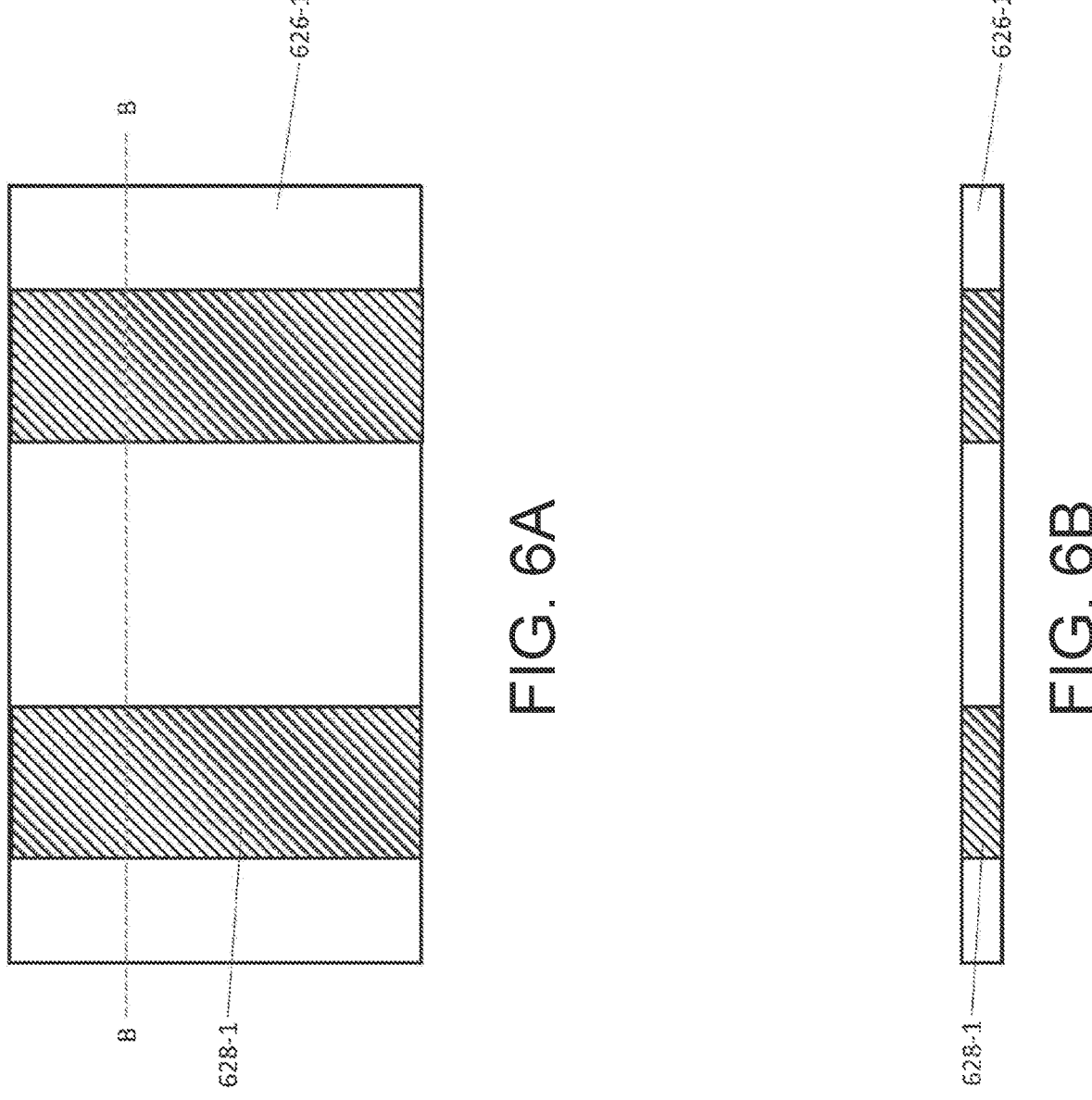

FIG. 5 is a cross-sectional view of a portion of the memory device 200 comprising a PCM cell 500 that may be used to replace the PCM cell 100 of FIG. 2, in accordance with some alternative embodiments of the present disclosure. The PCM cell 500 is substantially identical to the PCM cell 300 of FIG. 3 except that the phase change layer 504 includes four layers of chalcogenide material 512 (512-1, 512-2, 512-3, 512-4) and four layers of doped chalcogenide material 514 (514-1, 514-2, 514-3, 514-4) alternatingly stacked. In this embodiment, a first layer of doped chalcogenide material 514-1 is formed on a top surface of the second barrier electrode 308, a first layer of chalcogenide material 512-1 is formed on the first layer of doped chalcogenide material 514-1, a second layer of doped chalcogenide material 514-2 is formed on the first layer of chalcogenide material 512-1, a second layer of chalcogenide material 512-2 is formed on the second layer of doped chalcogenide material 514-2, and a third layer of doped chalcogenide material 514-3 is formed on the second layer of chalcogenide material 512-2, a third layer of chalcogenide material 512-3 is formed on the third layer of doped chalcogenide material 514-3, a fourth layer of doped chalcogenide material 514-4 is formed on the third layer of chalcogenide material 512-3, and a fourth layer of doped chalcogenide material 512-4 is formed on the fourth layer of doped chalcogenide material 514-4. Alternatively, the first, second, third, fourth layers of chalcogenide material 512-1, 512-2, 512-3, 512-4 may be swapped with the first, second, third, fourth layers of doped chalcogenide material 514-1, 514-2, 514-3, 514-4 so that the first layer of chalcogenide material 512-1 is formed on the top surface of the second barrier electrode 308.

In some embodiments, which can be combined with any one or more embodiments of the present disclosure, the first, second, third, fourth layers of chalcogenide material 512-1, 512-2, 512-3, 512-4 may include a material that is chemically different from each other, and the first, second, third, fourth layers of doped chalcogenide material 514-1, 514-2, 514-3, 514-4 may include a material that is chemically different from each other.

Likewise, the phase change layer 504 may have a height H7 in a range of about 200 Å to about 1000 Å, for example about 350 Å. The first, second, third, fourth layers of chalcogenide material 512-1, 512-2, 512-3, 512-4 may each have a height H8, and the first, second, third, fourth layers of doped chalcogenide material 514-1, 514-2, 514-3, 514-4 may each have a height H9 that is less than the height H8. In some embodiments, the height H8 and the height H9 may have a ratio (H8:H9) in a range of about 2:1 to about 10:1, for example about 4:1. In some embodiments, the height H7 and the height H9 may have a ratio (H7:H9) in a range of about 15:1 to about 25:1, for example about 20:1.

FIGS. 6A-17A are a top view of a portion of a memory device 600 (e.g., memory device 200 in FIG. 3) during various stages of manufacturing, in accordance with some embodiments of this disclosure. FIGS. 6B-17B are a vertical cross-sectional view of the portion of the memory device 600 taken along the plane B-B shown in FIGS. 6A-17A. FIG. 18 is a flowchart 1800 illustrating exemplary processing steps of a method for forming the memory device 600, in accordance with some embodiments of the present disclosure. It is understood that additional operations can be provided before, during, and after processes shown by FIGS. 6A-17A and 6B-17B as well as FIG. 18 and some of the operations described below can be replaced or eliminated, for additional embodiments of the method. The order of the operations/processes may be interchangeable. In FIGS.

6A-6B and operation 1802 of FIG. 18, a portion of the memory device 600 is illustrated after a subset of first conductive lines 628-1 (e.g., conductive line 228-4 in FIG. 3) are formed in a first interconnect-level dielectric layer 626-1 (e.g., dielectric layer 226-4 in FIG. 3). The first interconnect-level dielectric layer 626-1 is formed over a top surface of a substrate (not shown), such as the substrate 202 in FIG. 2. The first interconnect-level dielectric layer 626-1 may be any suitable dielectric material such as silicon oxide, and may be deposited by a chemical vapor deposition (CVD), a spin-coating process, or other suitable deposition technique. The first conductive lines 628-1 may be formed by forming an opening in the first interconnect-level dielectric layer 626-1 by a photolithography process and one or more etch processes, and filling the opening with a conductive material by any suitable process, such as ECP or PVD. A planarization process, such as a chemical mechanical planarization (CMP), may be performed to remove the conductive material from the top surface of the first interconnect-level dielectric layer 626-1. The conductive material remaining in the opening forms the first conductive lines 628-1.

Figures 7A, 7B:
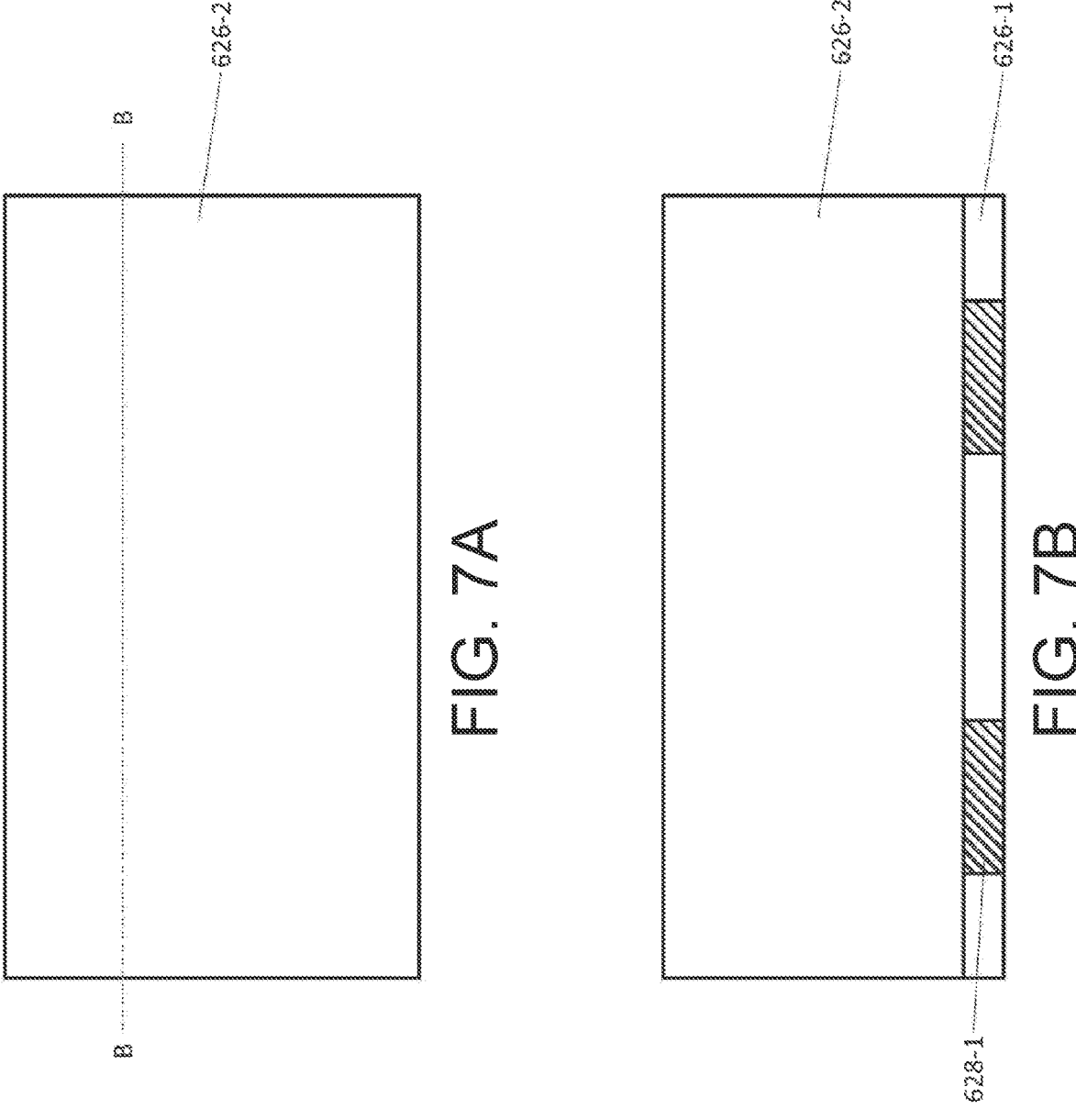

In FIGS. 7A-7B and operation 1804 of FIG. 18, a second interconnect-level dielectric layer 626-2 (e.g., dielectric layer 226-5 in FIG. 3) is formed over the first conductive lines 628-1. The second interconnect-level dielectric layer 626-2 may include the same material as the first interconnect-level dielectric layer 626-1 and may be deposited in a similar fashion.

Figures 8A, 8B:
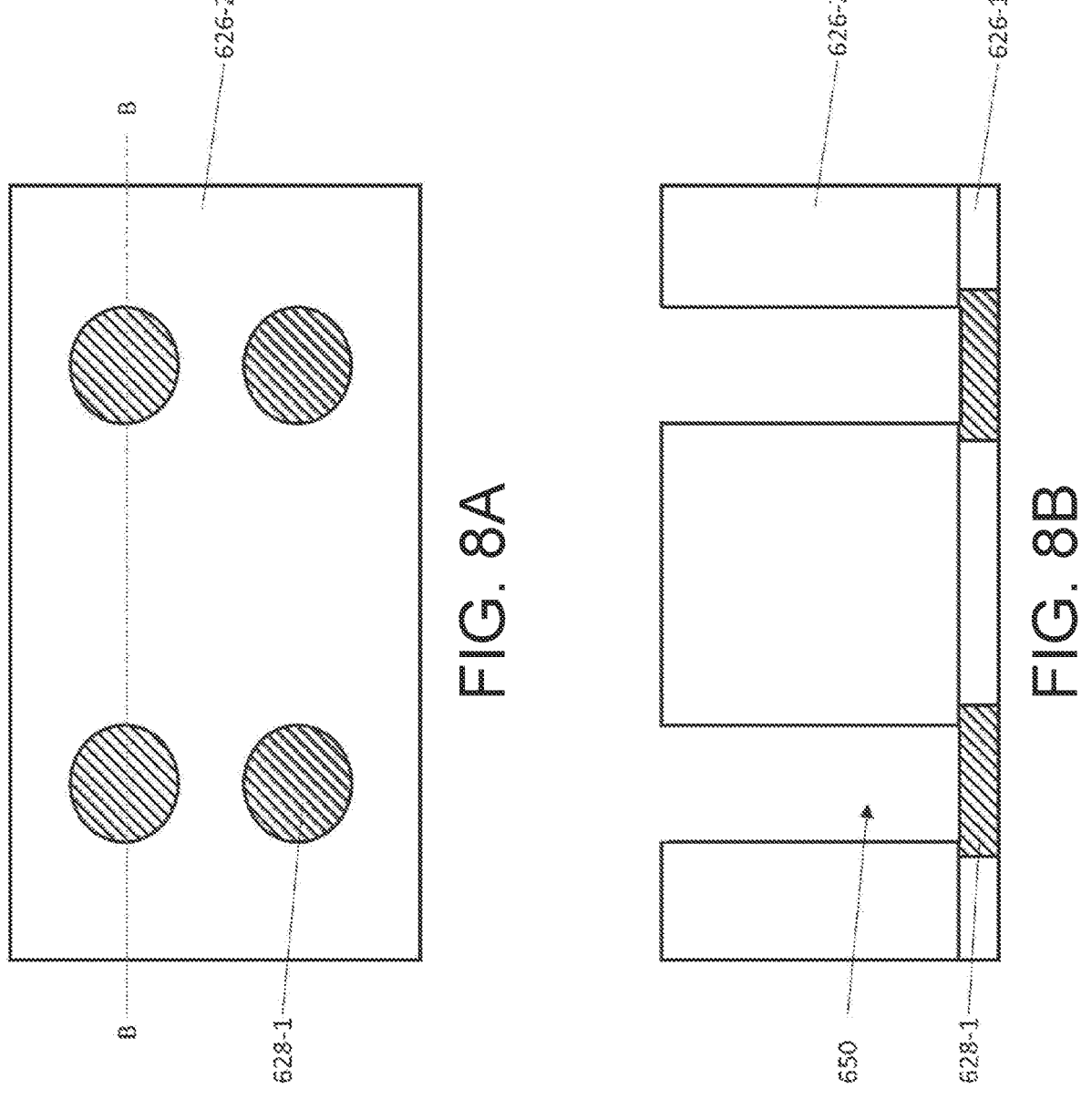

In FIGS. 8A-8B and operation 1806 of FIG. 18, openings 650 are formed through the second interconnect-level dielectric layer 626-2 to expose a top surface of the first conductive lines 628-1. A photoresist layer (not shown) may be applied over the top surface of the second interconnect-level dielectric layer 626-2, and may be lithographically patterned to form openings 650 therethrough. Each opening 650 may have a circular or oval cross-sectional shape. While openings 650 are shown with a uniform diameter (or width) from top to bottom, the openings 650 may have a variable diameter (i.e., sidewalls of the openings 650 have a non-zero taper angle) along the longitudinal direction of the openings 650 due to the etch process and/or lithographic masking process. For example, the openings 650 may have a first diameter adjacent to a top surface of the second interconnect-level dielectric layer 626-2 and a second diameter adjacent to the first conducive lines 628-1, and the first diameter is greater than the second diameter. Alternatively, the openings 650 may have a greater diameter (or width) at the bottom than at the top.

Figure 9A:
Figure 9B:

In FIGS. 9A-9B and operation 1808 of FIG. 18, a first barrier electrode 606 (e.g., first barrier electrode 306 in FIG. 3) is formed on the exposed top surface of the first conductive lines 628-1. The first barrier electrode 606 may use any suitable conductive material (e.g., TiN), which may be anisotropically deposited and isotropically etched back to form first barrier electrode 606 at the bottom of the openings 650. Alternatively, the first barrier electrode 606 may be deposited using a directional process, such as a collimated physical vapor deposition (PVD) process. The directional process is performed so that the majority of conductive material is deposited on the exposed first conductive lines 628-1 and a portion of conductive material on the sidewalls of the openings 650. An isotropic etch process, such as a dry etch using hydrogen-containing plasma, may then be performed to remove the portion of the conductive material from the sidewalls of the openings 650. The remaining portions of the conductive material at the bottom of the openings 650 constitute the first barrier electrode 606.

In some embodiments, the first barrier electrode 606 includes an elemental metal (e.g., Ru or W) that may be selectively grown from the metallic surfaces of the first conductive lines 628-1 exposed through the openings 650, while suppressing growth from dielectric surfaces of the second interconnect-level dielectric layer 626-2. In some embodiments where the first barrier electrode 606 uses ruthenium, ruthenium may be selectively grown from the metallic surfaces by an atomic layer deposition (ALD) process that uses a ruthenium-containing precursor and a reducing agent such as hydrogen.

Additionally or alternatively, a growth inhibitor may be formed selectively on dielectric surfaces of the second interconnect-level dielectric layer 626-2. The growth inhibitor may include one or more self-assembled monolayers (SAMs), which are molecule layers that can selectively adsorb on the dielectric surface to prevent the growth thereon. Each molecule layer includes a head group that facilitates the binding to the dielectric surface, an alkyl chain of a certain length that ensures the ordering in a monolayer, and a tail group that determines the character of the surface after functionalization. The selected molecule layer may adsorb on specific materials and the surface selectivity relies on either selective precursor or co-reactant adsorption. For example, octadecyltrichlorosilane (ODTS) molecules may adsorb selectively on OH-terminated $SiO_2$ surfaces while 1-octadecene molecules may adsorb selectively on H-terminated Si surface. With the growth inhibitor formed on the dielectric surfaces of the second interconnect-level dielectric layer 626-2, the conductive material of the first barrier electrode 606 is selectively formed on the exposed metallic surface of the first conductive lines 628-1 and not formed on the growth inhibitor. After the formation of the first barrier electrode 606, the molecule layer may be removed by any suitable process, such as a plasma or thermal process.

Figure 10A:
Figure 10B:

In FIGS. 10A-10B and operation 1810 of FIG. 18, a selector material layer 610 (e.g., selector material layer 310 in FIG. 3) is formed over the first barrier electrode 606. The selector material layer 610 may be formed by a selective deposition process that grows the selector material layer from a top surface of the underlying first barrier electrode 606 while suppressing growth of the selector material layer 610 on the exposed surfaces of the second interconnect-level dielectric layer 626-2. Alternatively, the selector material layer 610 may be formed by depositing the selector material in the openings 650 and over the top surface of the second interconnect-level dielectric layer 626-2 using a non-selective deposition process, followed by an isotropic etch process to recess the selector material. The selector material may be removed from above the top surface of the second interconnect-level dielectric layer 626-2 and from an upper volume of each opening 650, exposing portions of the sidewalls of the second interconnect-level dielectric layer 626-2. The upper volume of the openings 650 is revealed upon removal of the portion of the selector material. The remaining selector material on the first barrier electrode 606 forms the selector material layer 610.

In cases where the selector material layer 610 includes an ovonic threshold switch (OTS) material, the OTS material may be selectively grown using a CVD process. For example, precursor gases for germanium, selenium, and/or tellurium may be flowed into a process chamber to induce selective deposition of a germanium-selenium compound, a germanium-tellurium compound, or a germanium-selenium-tellurium compound. In some embodiments, an etchant gas may be intermittently flowed into the process chamber to enhance selectivity of the growth process. Alternatively, a self-assembled monolayer (SAM) that inhibits deposition of the OTS material may be selectively deposited on the exposed surfaces of the second interconnect-level dielectric layer 626-2 without coating the exposed surfaces of the first barrier electrode 606.

In cases where the selector material layer 610 includes a multilayer tunneling barrier stack structure (e.g., $TiO_x$), the metallic components of the multilayer tunneling barrier stack structure may be anisotropically deposited, for example, using a collimated PVD process. The metallic materials deposited on the sidewalls of the openings 650 may be etched back using an isotropic etch process. An oxidation process may be performed on the remaining portions of the metallic material deposited on the first barrier electrode 606. A combination of an anisotropic deposition process, an etch back process, and an oxidation process may be repeated for each component layer of the conductive bridge structure to provide the conductive bridge structure in each opening 650.

Figures 11A, 11B:
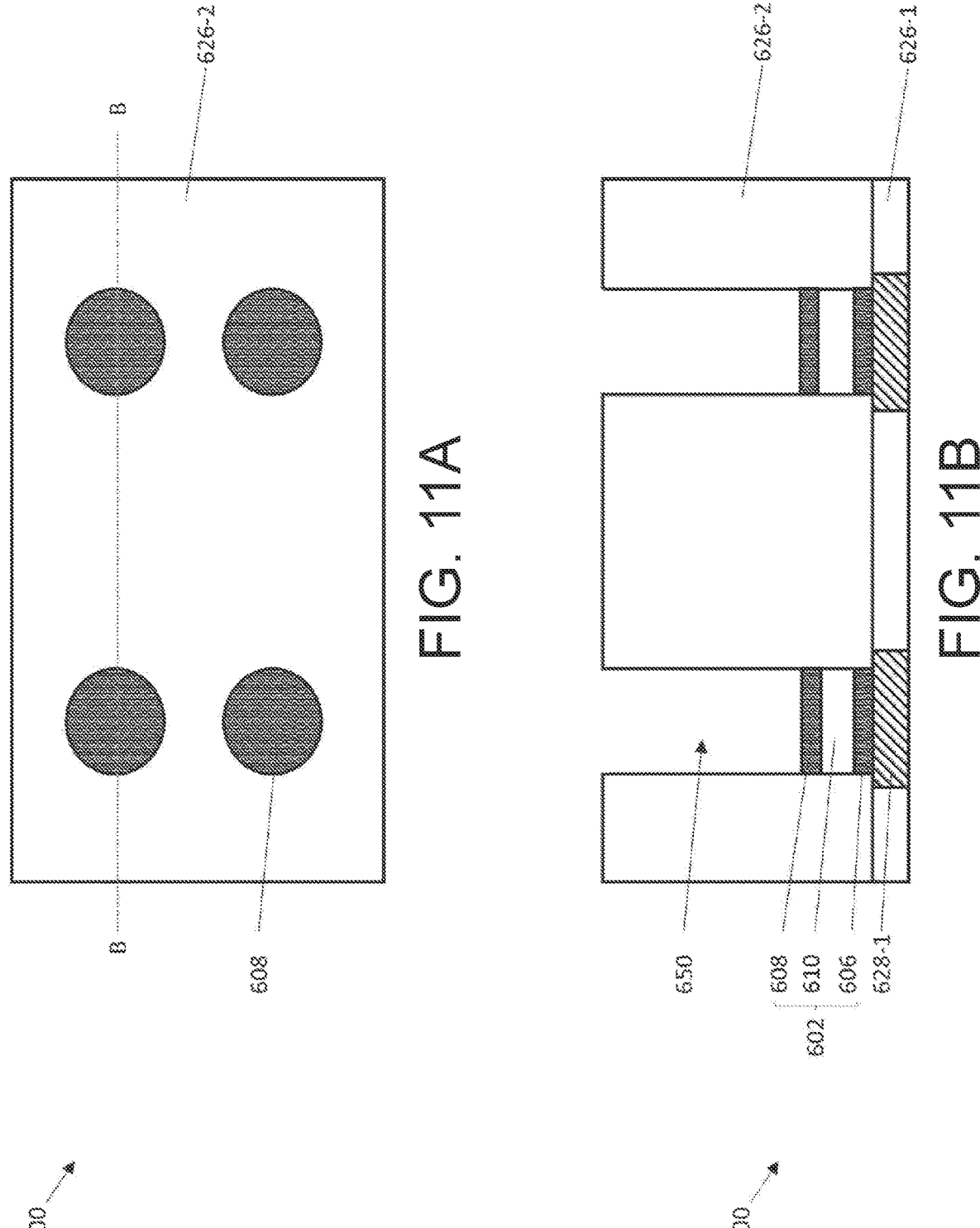

In FIGS. 11A-11B and operation 1812 of FIG. 18, a second barrier electrode 608 (e.g., second barrier electrode 308 in FIG. 3) is formed over the selector material layer 610. The second barrier electrode 608 may include the same material as the first barrier electrode 606, and may be deposited using the same deposition technique as the first barrier electrode 606. In cases where the second barrier electrode 608 includes an elemental metal (e.g., Ru or W), the top surface of the selector material layer 610 may function as metallic surfaces to enable selective growth of the conductive materials used for the second barrier electrode 608. The first barrier electrode 606, the selector material layer 610, and the second barrier electrode 608 serve as a selector 602 for the memory device 600.

Figures 12A, 12B:
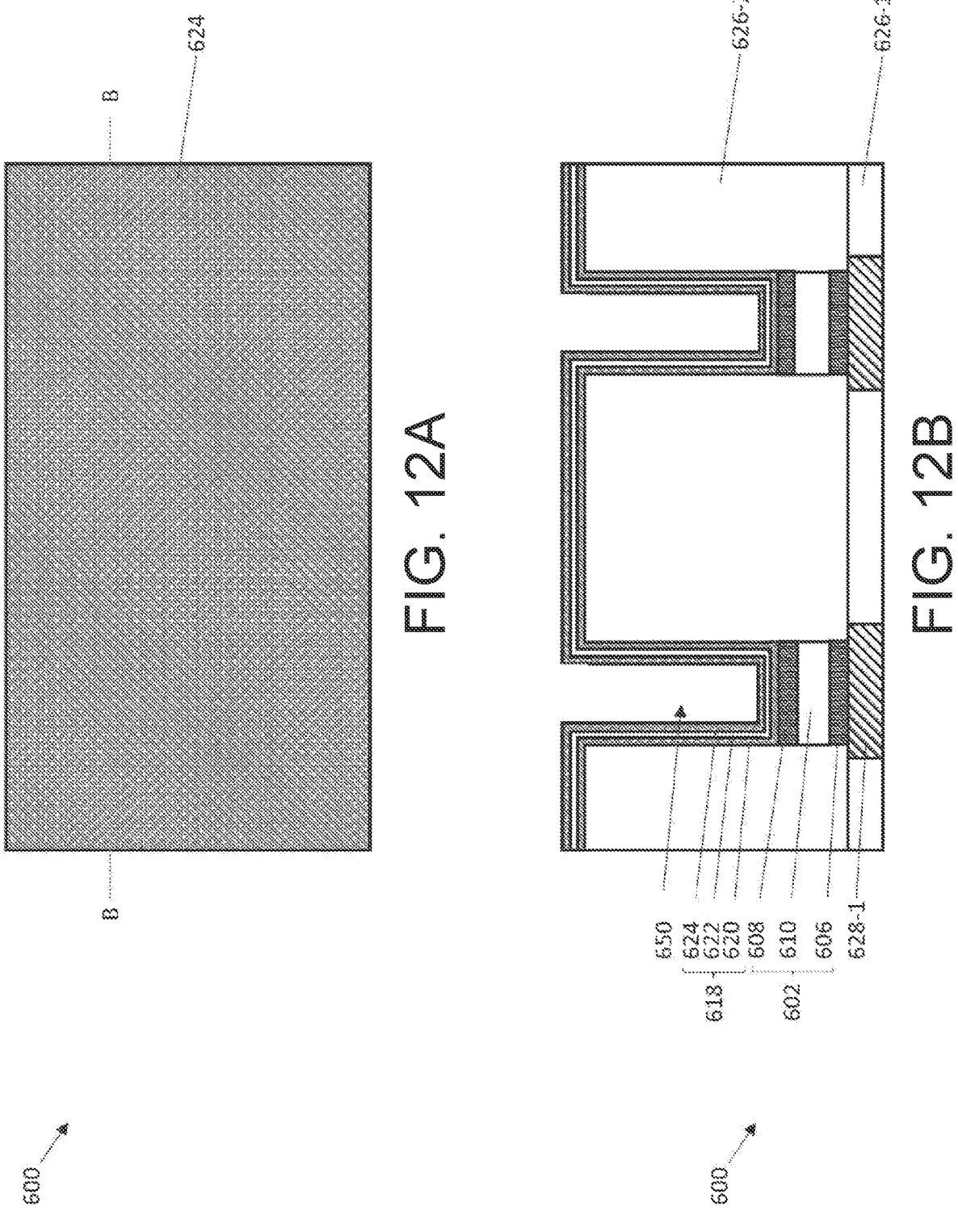

In FIGS. 12A-12B and operation 1814 of FIG. 18, a sidewall barrier layer 618 (e.g., sidewall barrier layer 318) is formed on the top surface of the second interconnect-level dielectric layer 626-2 and exposed surfaces within the openings 650. The sidewall barrier layer 618 includes alternating layers of nitride and oxide, such as a nitride/oxide (NO), an oxide/nitride (ON), or a nitride/oxide/nitride (NON). In one embodiment, the sidewall barrier layer 618 includes a first nitride layer 620 (e.g., first nitride layer 320 in FIG. 3), a second nitride layer 624 (e.g., second nitride layer 324 in FIG. 3), and an oxide layer 622 (e.g., oxide layer 322 in FIG. 3). The sidewall barrier layer 618 may be formed by depositing a blanket layer of the first nitride layer 620 on exposed surfaces of the second interconnect-level dielectric layer 626-2 and the second barrier electrode 608, a blanket layer of the oxide layer 622 on the blanket layer of the first nitride layer 620, and a blanket layer of the second nitride layer 624 on the blanket layer of the oxide layer 622. The sidewall barrier layer 618 may be deposited by ALD, CVD, or other suitable deposition technique. The sidewall barrier layer 618 have a nitride/oxide/nitride (NON) structure.

In FIGS. 13A-13B and operation 1814 of FIG. 18, an etch process is performed to remove portions of the first nitride layer 620, the oxide layer 622, and the second nitride layer 624. The etch process may be an anisotropic etch process that removes the sidewall barrier layer 618 from horizontal surfaces, such as top surfaces of the second interconnect-level dielectric layer 626-2 and the second barrier electrode 608, but not the sidewall barrier layer 618 on the vertical surfaces, such as sidewalls of the second interconnect-level dielectric layer 626-2 within the openings 650. The removal of portions of the first nitride layer 620, the oxide layer 622, and the second nitride layer 624 results in the sidewall barrier layer 618 formed on sidewalls of the second interconnect-level dielectric layer 626-2. The top surface of the second barrier electrode 608 is exposed again through the openings 650 as a result of the etch process.

Figures 14A, 14B:
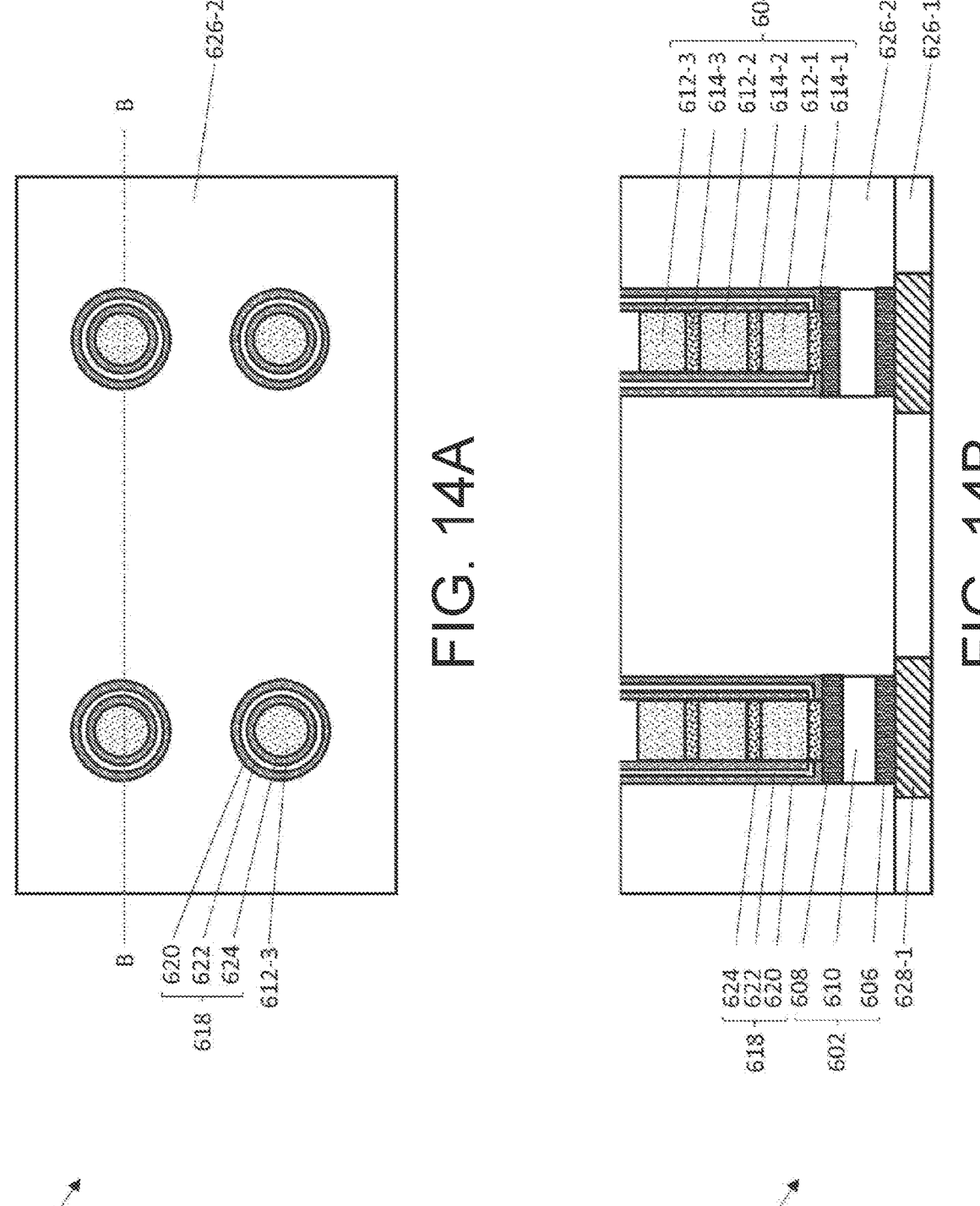

In FIGS. 14A-14B and operation 1816 of FIG. 18, a phase change layer 604 (e.g., phase change layer 404 of FIG. 4) is formed over the exposed surfaces of the second barrier electrode 608 and the sidewall barrier layer 618. The phase change layer 604 may include layers of chalcogenide material 612-1, 612-2, 612-3 (e.g., layers of chalcogenide material 312-1, 312-2, 312-3 of FIG. 3) and layers of doped chalcogenide material 614-1, 614-2, 614-3 (e.g., layers of doped chalcogenide material 314-1, 314-2, 314-3 of FIG. 3) alternatingly stacked over the selector 602. In one exemplary embodiment, the phase change layer 604 is a germanium-antimony-tellurium (GST) based compound (e.g., $Ge_2Sb_2Te_5$ ($GST_{225}$)). The phase change layer 604 may be formed by a collimated PVD process or any suitable directional deposition technique. For example, the first layer of doped chalcogenide material 614-1 may be deposited on the exposed top surface of the second barrier electrode 608 by the collimated PVD process, followed by an isotropic etch process to remove the first layer of doped chalcogenide material 614-1 from the exposed surface of the sidewall barrier layer 618 (e.g., second nitride layer 624). As a result, the first layer of doped chalcogenide material 614-1 remains on the second barrier electrode 608.

During the collimated PVD process, a noble gas (e.g., argon) and a dopant gas (e.g., nitrogen, oxygen, carbon, silicon, indium or tungsten-containing gas) are flowed into the process chamber in which the memory device 600 is disposed on a pedestal, and a power supply is turned on to form a plasma in the process chamber. A target including the GST-based compound is biased negatively to attract positively charged argon ions in the plasma. The argon ions strike the target with sufficient energy to cause target atoms to be sputtered from the target. An RF bias is applied to the pedestal to assist directional sputtering of the target atoms. The target atoms along with the dopant atoms are deposited on the exposed surfaces of the second barrier electrode 608 and the second nitride layer 624 to form the first layer of doped chalcogenide material 614-1. After the first layer of doped chalcogenide material 614-1 reaches the desired thickness, the collimated PVD process is terminated and an isotropic etch process is performed. The etchant of the isotropic etch process may be selective so that it selectively removes the first layer of doped chalcogenide material 614-1 without substantially affecting the second nitride layer 624.

Once the first layer of doped chalcogenide material 614-1 is formed on the exposed top surface of the second barrier electrode 608, the first layer of chalcogenide material 612-1 is formed on the first layer of doped chalcogenide material 614-1. The first layer of chalcogenide material 612-1 may be deposited using a similar fashion as the first layer of doped chalcogenide material 614-1 except that no dopant gas is flowed into the process chamber during the collimated PVD process of the first layer of chalcogenide material 612-1. The collimated PVD process and the isotropic etch process are performed so that the first layer of chalcogenide material 612-1 is formed with a height (or thickness) that is greater than (e.g., four times greater) the height (or thickness) of the first layer of doped chalcogenide material 614-1. The collimated PVD process and the isotropic etch process may be repeated until the second and third layers of chalcogenide material 612-2, 612-3 and second and third layers of doped chalcogenide material 614-2, 614-3 are alternatingly formed over the selector 602.

After the third layer of chalcogenide material 612-3 is formed on the third layer of doped chalcogenide material 614-3, an optional etch back process may be performed to remove portions of the third layer of chalcogenide material 612-3. The etch back process is performed so that the top surface of the third layer of chalcogenide material 612-3 is at an elevation lower than the top surface of the interconnect-level dielectric layer 626-2. The removal of the portions of the third layer of chalcogenide material 612-3 creates room for the subsequent top barrier electrode 616.

In some embodiments, the phase change layer 604 (e.g., GST-based compound) may be formed by a selective growth process. In such cases, precursor gases for germanium, antimony, and tellurium may be sequentially or simultaneously flowed into a process chamber in which an ALD-based process or a CVD-based process is performed to form layers of chalcogenide material 612-1, 612-2, 612-3. For example, $Ge(i-C_4H_9)_4$, $Sb(i-C_3H_7)_3$, and $Te(i-C_3H_7)_2$ may be used as a germanium precursor, an antimony precursor, and a tellurium precursor, respectively. The precursor gases preferentially nucleate on the metallic surfaces of the second barrier electrode 608, while nucleation on the dielectric surfaces of the second nitride layer 624 is retarded. Optionally, an etchant gas may be flowed into the process chamber simultaneously or alternately with the flow of the precursor gases from germanium, antimony, and tellurium. To form layers of doped chalcogenide material 614-1, 614-2, 614-3, the precursor gases may further include a dopant gas, such as nitrogen, oxygen, carbon, silicon, indium or tungsten-containing gas. Optionally, a self-assembled monolayer (SAM) including a growth inhibitor may be used in conjunction with the ALD-based or CVD-based process. The growth inhibitor may include the same material as the growth inhibitor that suppresses deposition of the conductive material during formation of the first barrier electrode 606 as discussed above. In such an embodiment, the molecules of the SAM may include a head group that is attached to the exposed surfaces of the second nitride layer 624 without attaching itself to the exposed top surfaces of the second barrier electrode 608. The molecules of the SAM may include a tail group that inhibits adhesion of any metallic precursor material.

Figures 15A, 15B:
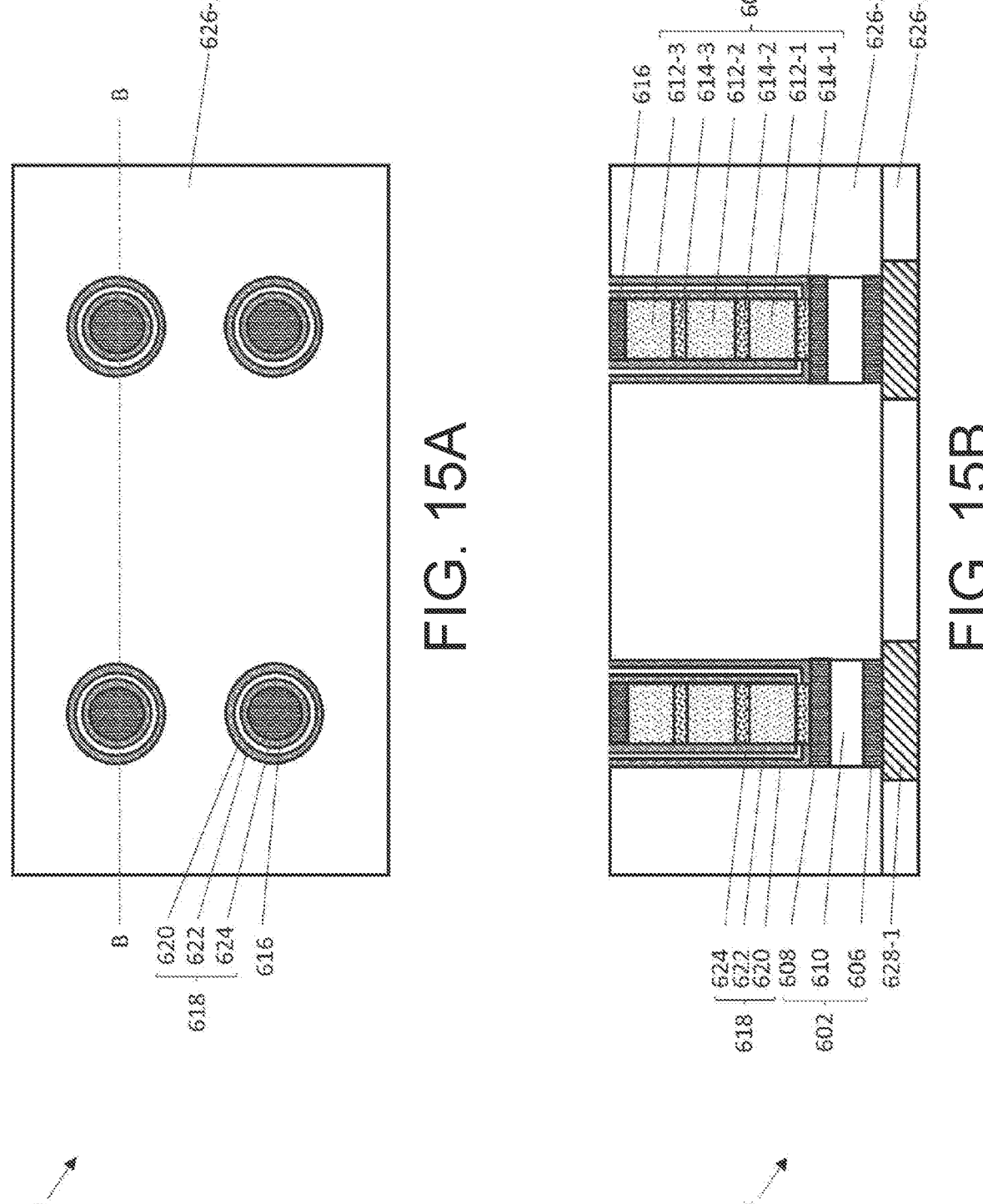

In FIGS. 15A-15B and operation 1818 of FIG. 18, a top barrier electrode 616 (e.g., top barrier electrode 316 of FIG. 3) is formed over phase change layer 604. In one embodiment, the top barrier electrode 616 is formed on the third layer of chalcogenide material 612-3. The top barrier electrode 616 may include the same material as the first and second barrier electrodes 606, 608, and may be formed in a similar fashion as the first and second barrier electrodes 606, 608 discussed above. The top barrier electrode 616 may be formed on the third layer of chalcogenide material 612-3 and over the top surface of the interconnect-level dielectric layer 626-2. A planarization process, such as a CMP process, may be performed on the top barrier electrode 616 until the top surface of the interconnect-level dielectric layer 626-2 is exposed. Upon completion of the planarization process, the top surfaces of the top barrier electrode 616, the sidewall barrier layer 618, and the interconnect-level dielectric layer 626-2 are substantially co-planar.

Figures 16A, 16B:
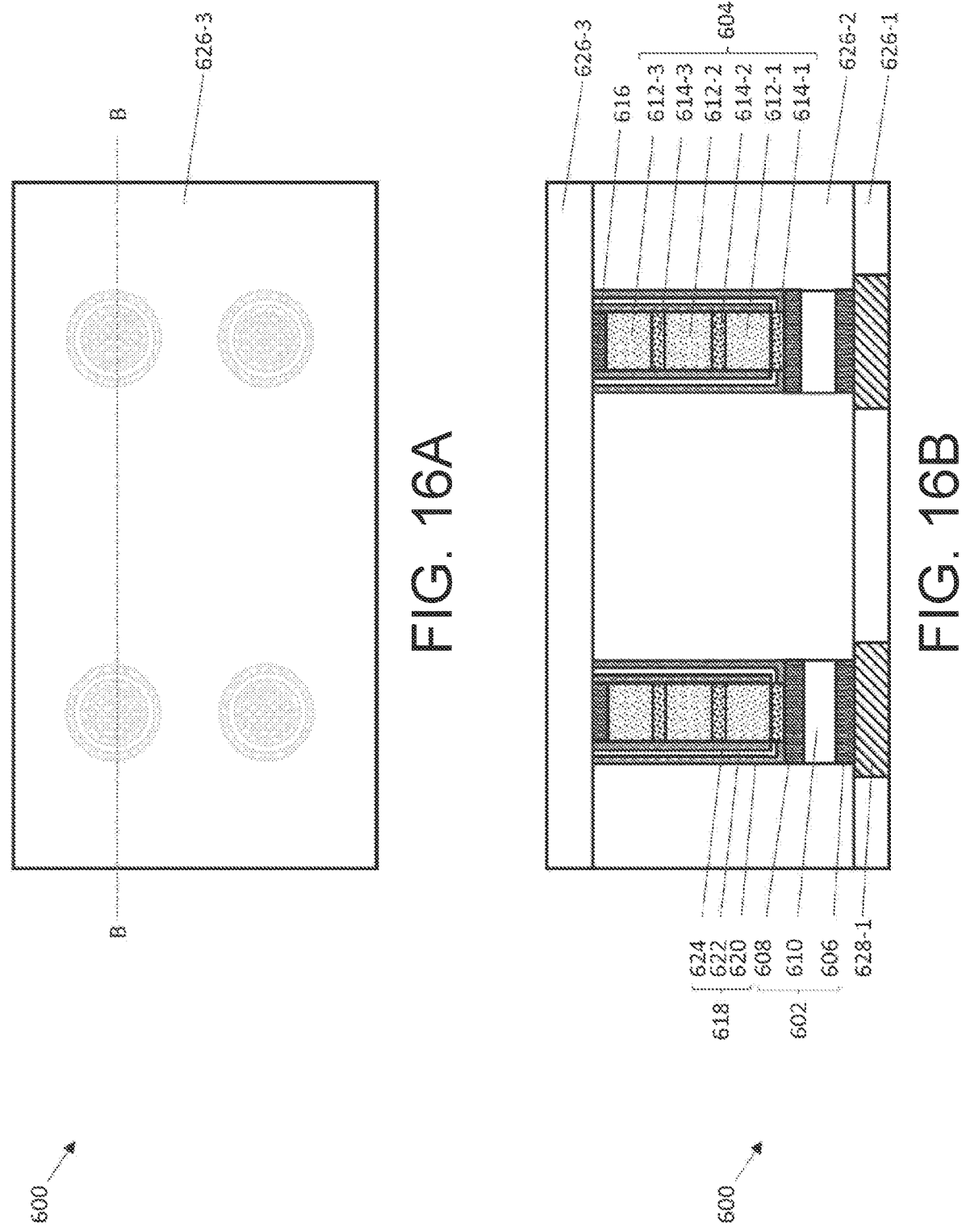

In FIGS. 16A-16B and operation 1820 of FIG. 18, a dielectric layer 626-3 is formed over the top surfaces of the top barrier electrode 616, the sidewall barrier layer 618, and the second interconnect-level dielectric layer 626-2. The dielectric layer 626-3 may be formed as an upper portion of the second interconnect-level dielectric. The dielectric layer 626-3 may include the same material as the second interconnect-level dielectric layer 626-2 and may be deposited in a similar fashion.

Figures 17A, 17B:
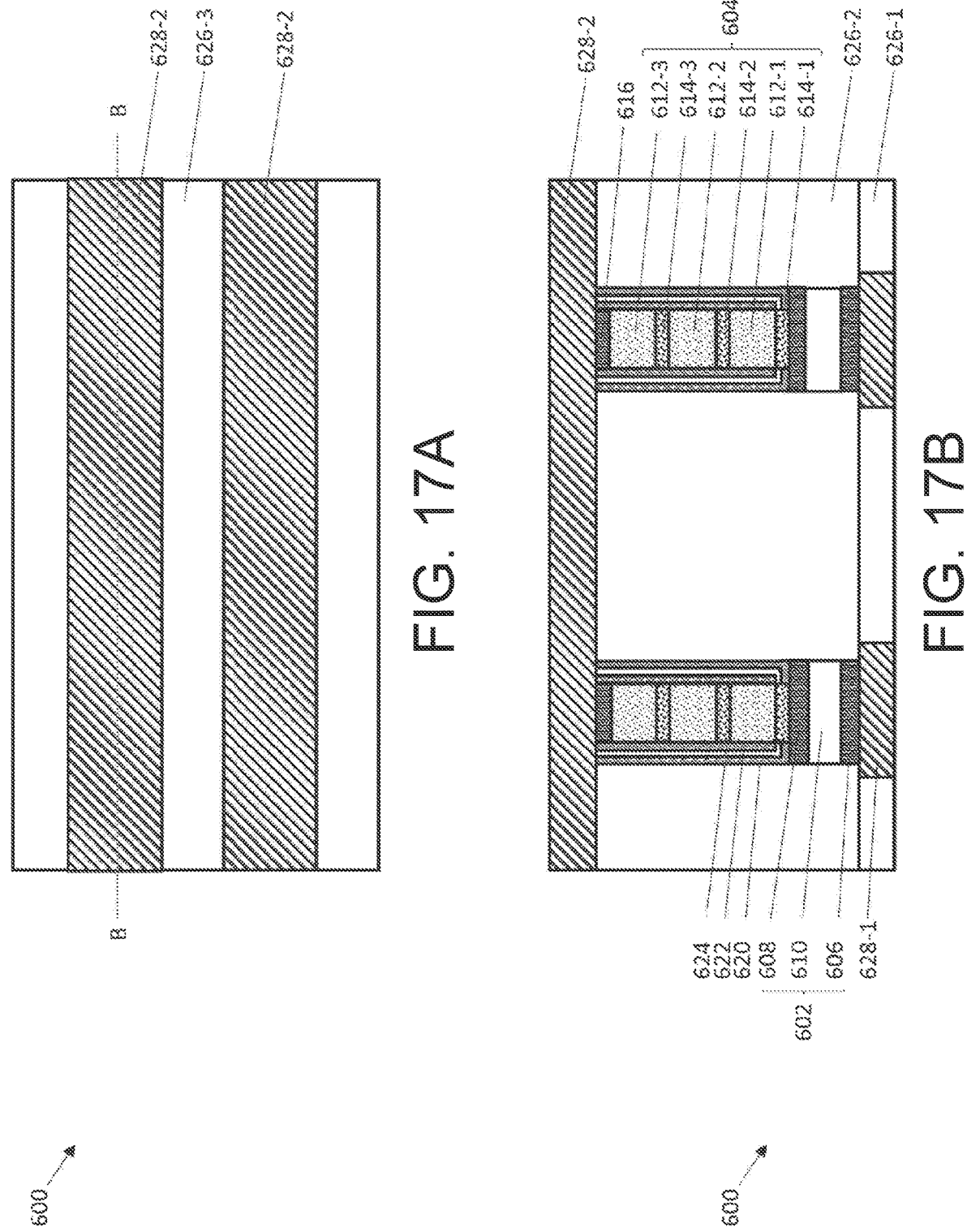

In FIGS. 17A-17B and operation 1822 of FIG. 18, a photoresist layer (not shown) is applied over the dielectric layer 626-3, and may be lithographically patterned to form openings in the photoresist layer. The openings expose the top surface of the dielectric layer 626-3. The openings in the photoresist layer are arranged over a respective one of the first conductive lines 628-1 in the first interconnect-level dielectric layer 626-1. An anisotropic etch process is performed to transfer the pattern of the openings through the dielectric layer 626-3 to expose the top surface of the top barrier electrode 616. The photoresist layer may be removed by ashing. The openings are then filled with an electrically conductive material, such as the material used for the first conductive lines 628-1. Excess portions of the electrically conductive material may be removed from above the top surface of the dielectric layer 626-3 by a planarization process. The electrically conductive material remaining in the openings constitutes the second conductive lines 628-2 (e.g., conductive line 228-5 in FIG. 3). The top barrier electrode 616 is thus electrically connected to the second conductive lines 628-2, which may serve as a bit line, while a respective gate electrode (not shown, such as gate electrode 216 in FIG. 2) of a current-controlling device (e.g., current-controlling device 201 in FIG. 2) is electrically connected to the first conductive lines 628-1, which may serve as a word line.

Figure 19:
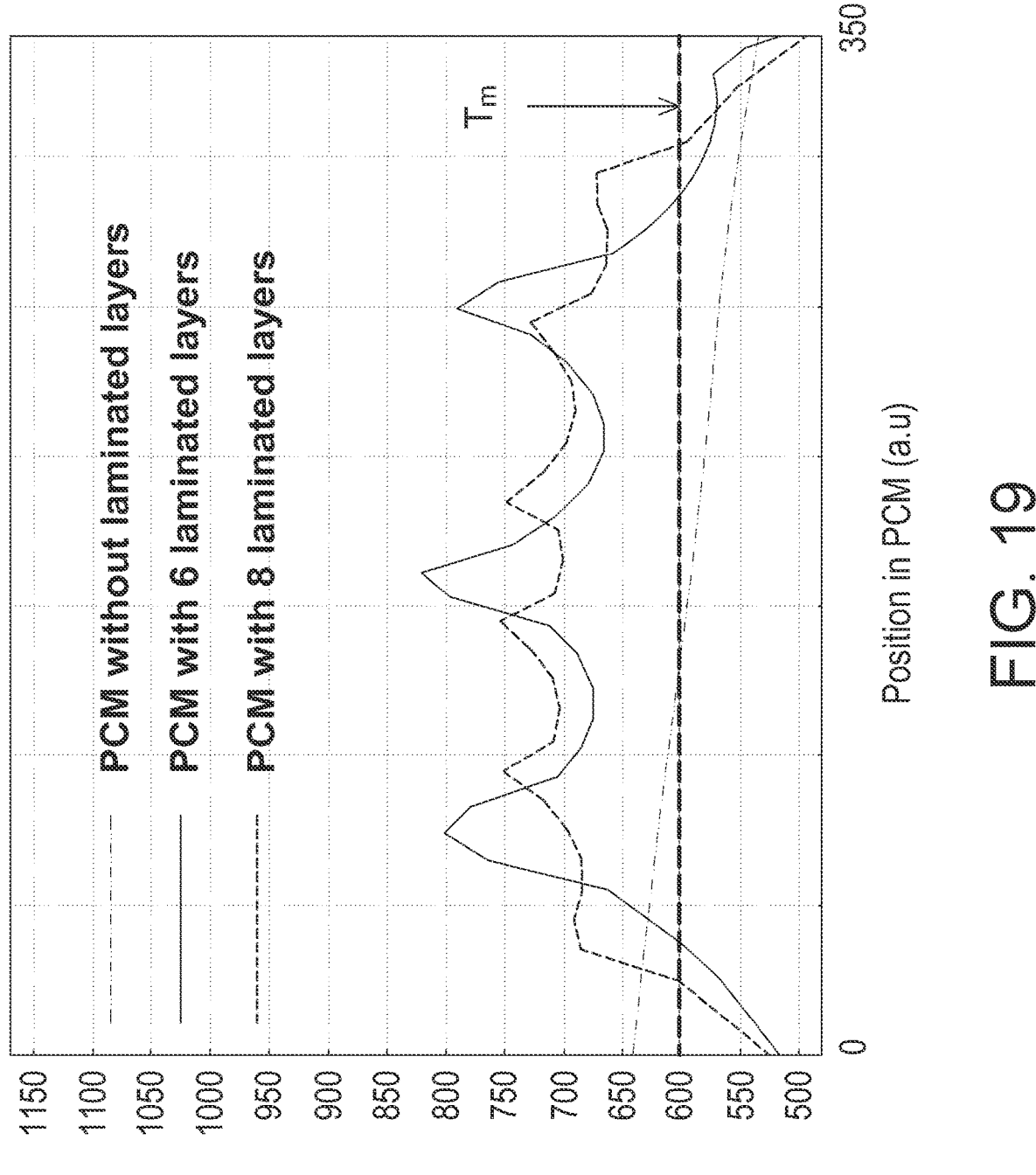
FIG. 19 is a graph showing temperature measured in various positions of phase change material when a constant Joule heating is provided for phase change material with and without laminated structure, in accordance with some embodiments of the present disclosure.

FIG. 19 is a graph showing temperature measured in various positions of phase change material when a constant Joule heating (i.e., programming current) is provided for: (1) a single bulk GST-based phase change material without laminated structure, (2) a GST-based phase change material having six laminated layers (e.g., phase change layer 404 in FIG. 4), and (3) a GST-based phase change material having eight laminated layers (e.g., phase change layer 504 in FIG. 5). As can be seen, the measured temperature gradually decreases with increasing height positions in the single bulk GST-based phase change material, and only about 40% of the material body can reach a temperature above the melting temperature (Tm) of the GST-based phase change material when a constant programming current is applied. In contrast, the measured temperature shows multiple peaks with increasing height positions in the GST-based phase change material having six or eight laminated layers, and at least about 72% of the material body can reach a temperature above the melting temperature of the GST-based phase change material when a constant programming current is applied. Comparing to the single bulk GST-based phase change material, the programming current needed for the laminated structure of the GST-based phase change material to reach its melting temperature can be reduced by 27.2% (6 laminated layers) and 32.3% (8 laminated layers). The graph shows that the inventive phase change layers 404, 504 with laminated structures provide decreased thermal conductivity and enhanced heat confinement, which are beneficial for efficient heating of the phase change layers to its melting temperature and fast transformation between an amorphous phase and a crystalline phase. This leads to low energy consumption, fast operating speeds, and improved reliability of PCMs.

Various embodiments of the present disclosure provide a memory device and methods of forming the same. The memory device includes a phase change layer having a laminated structure formed of chalcogenides. Particularly, the phase change layer includes a layer of undoped chalcogenide material and a layer of doped chalcogenide material alternatingly stacked over a selector. Doped chalcogenide materials can increase resistivity and crystallization temperature of the phase change material, resulting in lower programming current and thus reduced energy consumption. Undoped chalcogenide materials provide faster switching speeds needed for the memory device. The phase change layer containing laminated or multi-layered structure can achieve its crystalline phase with lower operating energy due to the presence of multiple interfaces (e.g., interfaces between undoped chalcogenide material and doped chalcogenide material) in the phase change layer. As a result, the phase change layer can be efficiently heated to its melting temperature with a constant programming current when compared to phase change layers employing one single bulk chalcogenide material (either doped or undoped), which are beneficial for fast transformation between an amorphous phase and a crystalline phase. This also leads to low energy consumption, fast operating speeds, and improved reliability of PCMs.

An embodiment is a memory device. The memory device includes a substrate, a bottom electrode disposed over the substrate, a top electrode disposed over the bottom electrode, and a phase change layer disposed between the top electrode and the bottom electrode. The phase change layer is a laminated structure comprising a first layer of phase change material and a second layer of phase change material alternatingly stacked, and the first layer of phase change material is chemically different from the second layer of phase change material, wherein the first layer of phase change material has a first thickness that is less than a second thickness of the second layer of phase change material.

Another embodiment is a memory device. The memory device includes a word line disposed in an interconnect-level dielectric layer stack, a selector disposed over the word line in the interconnect-level dielectric layer stack, a phase change layer disposed over the selector in the interconnect-level dielectric layer stack. The phase change layer includes a first layer of doped chalcogenide material, a first layer of undoped chalcogenide material disposed above and in contact with the first layer of doped chalcogenide material, a second layer of doped chalcogenide material disposed above and in contact with the first layer of undoped chalcogenide material, and a second layer of undoped chalcogenide material disposed above and in contact with the second layer of doped chalcogenide material. The memory device also includes a bit line disposed over the phase change layer in the interconnect-level dielectric layer stack.

A further embodiment is a method for forming a memory device. The method includes providing first conductive lines in a first interconnect-level dielectric layer over a substrate, forming a second interconnect-level dielectric layer over the first interconnect-level dielectric layer, wherein the second interconnect-level dielectric layer is etched to have first openings extending through the second interconnect-level dielectric layer to expose a top surface of the first conductive lines. The method also includes providing a selector within the first openings over the top surface of the first conductive lines, sequentially depositing a blanket layer of a first nitride layer, a blanket layer of an oxide layer, and a blanket layer of a second nitride layer on exposed surfaces of the second interconnect-level dielectric layer and the selector, performing an etch process to remove portions of the first nitride layer, the oxide layer, and the second nitride layer from top surfaces of the second interconnect-level dielectric layer and the selector, providing within the first openings a laminated structure of a phase change layer by alternatingly depositing a first layer of doped phase change material and a second layer of undoped phase change material, wherein the first layer of doped phase change material has a first thickness that is less than a second thickness of the second layer of undoped phase change material. The method further includes depositing a top barrier electrode within the first openings over the laminated structure of the phase change layer so that top surfaces of the top barrier electrode, the first nitride layer, the oxide layer, the second nitride layer, and the second interconnect-level dielectric layer are substantially co-planar, forming a third interconnect-level dielectric layer over the second interconnect-level dielectric layer, wherein the third interconnect-level dielectric layer is etched to have second openings extending through the third interconnect-level dielectric layer to expose a top surface of the top barrier electrode, and forming a second conductive line in the second openings so that the second conductive lines are electrically connected to the top barrier electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A memory device, comprising:
a substrate;
a bottom electrode disposed over the substrate;
a top electrode disposed over the bottom electrode; and
a phase change layer disposed between the top electrode and the bottom electrode, wherein the phase change layer is a laminated structure comprising a first layer of phase change material and a second layer of phase change material alternatingly stacked, and the first layer of phase change material is chemically different from the second layer of phase change material, and wherein the first layer of phase change material has a first thickness that is less than a second thickness of the second layer of phase change material; and
a sidewall barrier layer in contact with sidewalls of the phase change layer,
wherein the first layer of phase change material is a doped chalcogenide material containing a metallic dopant element and the second layer of phase change material is an undoped chalcogenide material,
wherein at least a first one of the first layer of phase change material in the laminated structure has a first dopant concentration, and at least a second one of the first layer of phase change material has a second dopant concentration that is different than the first dopant concentration, and
wherein a topmost one of the second layer of phase change material is disposed adjacent to and in contact with the top electrode, and the first layer of phase change material in the laminated structure is disposed on and in contact with the bottom electrode, and
wherein a side surface of the sidewall barrier layer is in contact with a sidewall of the top electrode, and a bottom surface of the sidewall barrier layer is in contact with a top surface of the bottom electrode.

2. The memory device of claim 1, wherein the chalcogenide material comprises at least one or more of germanium (Ge), antimony (Sb), tellurium (Te), selenium (Se), and sulfide(S).

3. The memory device of claim 2, wherein the doped or undoped chalcogenide material comprises a Ge—Sb—Te (GST) based compound, a Si—Sb—Te based compound, a Ga—Sb—Te based compound, an As—Sb—Te based compound, an Ag—In—Sb—Te (AIST) based compound, a Ge—In—Sb—Te (GIST) based compound, a Ti—Sb—Te based compound, a Ge—Sb based compound, a Ge—Te based compound, a Ga—Sb based compound, a Sb—Te based compound, a Si—Sb based compound, a Se—S based compound, an As—Te based compound, an As—Se based compound, or stoichiometric materials thereof.

4. The memory device of claim 3, wherein the doped chalcogenide material further comprises a non-metal dopant element.

5. The memory device of claim 4, wherein the non-metal dopant element comprises nitrogen (N), oxygen (O), carbon (C), silicon (Si), boron (B), phosphorus (P), or the like.

6. The memory device of claim 1, wherein the first layer of phase change material is a GST based compound doped with tungsten (W), indium (In), gallium (Ga), niobium (Nb), zirconium (Zr), yttrium (Y), molybdenum (Mo), or the like, and the second layer of phase change material is a GST based compound.

7. The memory device of claim 1, wherein the first thickness and the second thickness have a ratio (first thickness:second thickness) in a range of about 1:2 to about 1:10.

8. The memory device of claim 7, wherein the phase change layer has a third thickness, and the third thickness and the first thickness have a ratio (third thickness:first thickness) in a range of about 5:1 to about 15:1.

9. The memory device of claim 1,
wherein the sidewall barrier layer comprises a Nitride-Oxide-Nitride (NON) structure.

10. The memory device of claim 1, wherein the second layer of phase change material has a RMS roughness in a range of about 0.100 nm to about 0.125 nm.

11. A memory device, comprising:
a word line disposed in an interconnect-level dielectric layer stack;
a selector disposed over the word line in the interconnect-level dielectric layer stack;
a phase change layer disposed over the selector in the interconnect-level dielectric layer stack, the phase change layer comprising:
a first layer of doped chalcogenide material containing a first dopant element;
a first layer of undoped chalcogenide material disposed above and in contact with the first layer of doped chalcogenide material;
a second layer of doped chalcogenide material containing a second dopant element that is different than the first dopant element, wherein the second layer of doped chalcogenide material is disposed above and in contact with the first layer of undoped chalcogenide material; and
a second layer of undoped chalcogenide material disposed above and in contact with the second layer of doped chalcogenide material;
a sidewall barrier layer in contact with sidewalls of the phase change layer; and a bit line disposed over the phase change layer in the interconnect-level dielectric layer stack, wherein the second layer of undoped chalcogenide material is disposed adjacent to the bit line, and the first layer of doped chalcogenide material is disposed on and in contact with a top surface of a second barrier electrode of the selector, and wherein a top surface of the sidewall barrier layer is in contact with a bottom surface of the bit line, and a bottom surface of the sidewall barrier layer is in contact with the top surface of the second barrier electrode of the selector.

12. The memory device of claim 11, wherein the phase change layer further comprises:

a third layer of doped chalcogenide material containing the first dopant element, wherein the third layer of doped chalcogenide material is disposed above and in contact with the second layer of undoped chalcogenide material; and a third layer of undoped chalcogenide material disposed above and in contact with the third layer of doped chalcogenide material.

13. The memory device of claim 11, wherein the first, second, third layers of doped chalcogenide material and the first, second, third layers of undoped chalcogenide material comprise at least one or more of germanium (Ge), antimony (Sb), tellurium (Te), selenium (Se), and sulfide(S).

14. The memory device of claim 13, wherein the first, second, third layers of doped chalcogenide material are a GST compound doped with nitrogen (N), oxygen (O), carbon (C), silicon (Si), boron (B), phosphorus (P), or the like.

15. The memory device of claim 11, wherein the each of first and second layers of doped chalcogenide material has a first thickness, and each of the first and second layers of undoped chalcogenide material has a second thickness that is at least two times greater than the first thickness.

16. The memory device of claim 11, wherein the selector further comprises:

a first barrier electrode;

the second barrier electrode; and a selector material layer disposed between the first and second barrier electrodes.

17. The memory device of claim 16, wherein the first barrier electrode is in contact with the word line, and the second barrier electrode is in contact with the first layer of doped chalcogenide material.

18. The memory device of claim 11, further comprising:

a top barrier electrode disposed over the phase change layer wherein the sidewall barrier layer is in contact with sidewalls of the top barrier electrode.

19. The memory device of claim 11, wherein the each of first and second layers of doped chalcogenide material has a first thickness, and each of the first and second layers of undoped chalcogenide material has a second thickness that is greater than the first thickness.

20. A memory device, comprising:

a word line disposed in an interconnect-level dielectric layer stack;

a bit line disposed over the word line in the interconnect-level dielectric layer stack;

a selector disposed in the interconnect-level dielectric layer stack;

a phase change layer disposed between the world line and the bit line, the phase change layer comprising:

a first layer of doped chalcogenide material containing a first metallic dopant element;

a first layer of undoped chalcogenide material disposed adjacent the first layer of doped chalcogenide material;

a second layer of doped chalcogenide material containing a second metallic dopant element that is different than the first metallic dopant element, and the second layer of doped chalcogenide material is disposed adjacent the first layer of undoped chalcogenide material; and a second layer of undoped chalcogenide material disposed adjacent the second layer of doped chalcogenide material and the bit line; and a sidewall barrier layer in contact with sidewalls of the phase change layer, wherein the first layer of doped chalcogenide material is disposed on and in contact with a top surface of a first barrier electrode of the selector, and wherein a top surface of the sidewall barrier layer is in contact with a bottom surface of the bit line, and a bottom surface of the sidewall barrier layer is in contact with the top surface of the first barrier electrode of the selector.

\* \* \* \* \*